(12) United States Patent
Lee

(10) Patent No.: US 7,692,193 B2
(45) Date of Patent: Apr. 6, 2010

(54) ARRAY SUBSTRATE FOR LIQUID CRYSTAL DISPLAY DEVICE AND METHOD OF FABRICATING THE SAME

(75) Inventor: Chang-Bin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 203 days.

(21) Appl. No.: 11/819,418

(22) Filed: Jun. 27, 2007

(65) Prior Publication Data
US 2008/0001154 A1    Jan. 3, 2008

(30) Foreign Application Priority Data
Jun. 30, 2006    (KR)    ............. 10-2006-0060903

(51) Int. Cl.
*H01L 31/00*    (2006.01)
(52) U.S. Cl. .............. 257/59; 257/40; 257/E21.413; 257/E21.414; 349/47
(58) Field of Classification Search ............ 257/40, 257/E21.413, 59, E21.414; 349/47
See application file for complete search history.

(56) References Cited

U.S. PATENT DOCUMENTS

| | | | | |
|---|---|---|---|---|
| 5,496,749 A | * | 3/1996 | Nasu et al. | 438/30 |
| 5,614,731 A | * | 3/1997 | Uchikoga et al. | 257/59 |
| 5,668,379 A | * | 9/1997 | Ono et al. | 257/59 |
| 6,972,820 B2 | * | 12/2005 | Lee et al. | 349/152 |

* cited by examiner

*Primary Examiner*—Wael Fahmy
*Assistant Examiner*—John C Ingham
(74) *Attorney, Agent, or Firm*—Morgan Lewis & Bockius LLP

(57) ABSTRACT

An array substrate for a liquid crystal display device includes a gate and a data lines on a substrate intersecting each other, the data line includes a first layer formed of a transparent conductive material and a second layer under the first layer; a thin film transistor including a gate electrode connected to the gate line formed at respective intersection of the gate and data lines, an insulating layer on the gate electrode, an active layer on the insulating layer disposed within the gate electrode, an etch stopper on the active layer, an ohmic contact layer on the etch stopper, a source electrode on the ohmic contact layer and connected to the first layer, a drain electrode spaced apart from the source electrode; a pixel electrode connected to the drain electrode, wherein the source, drain and pixel electrodes are formed of the same layer and material as the first layer.

8 Claims, 42 Drawing Sheets

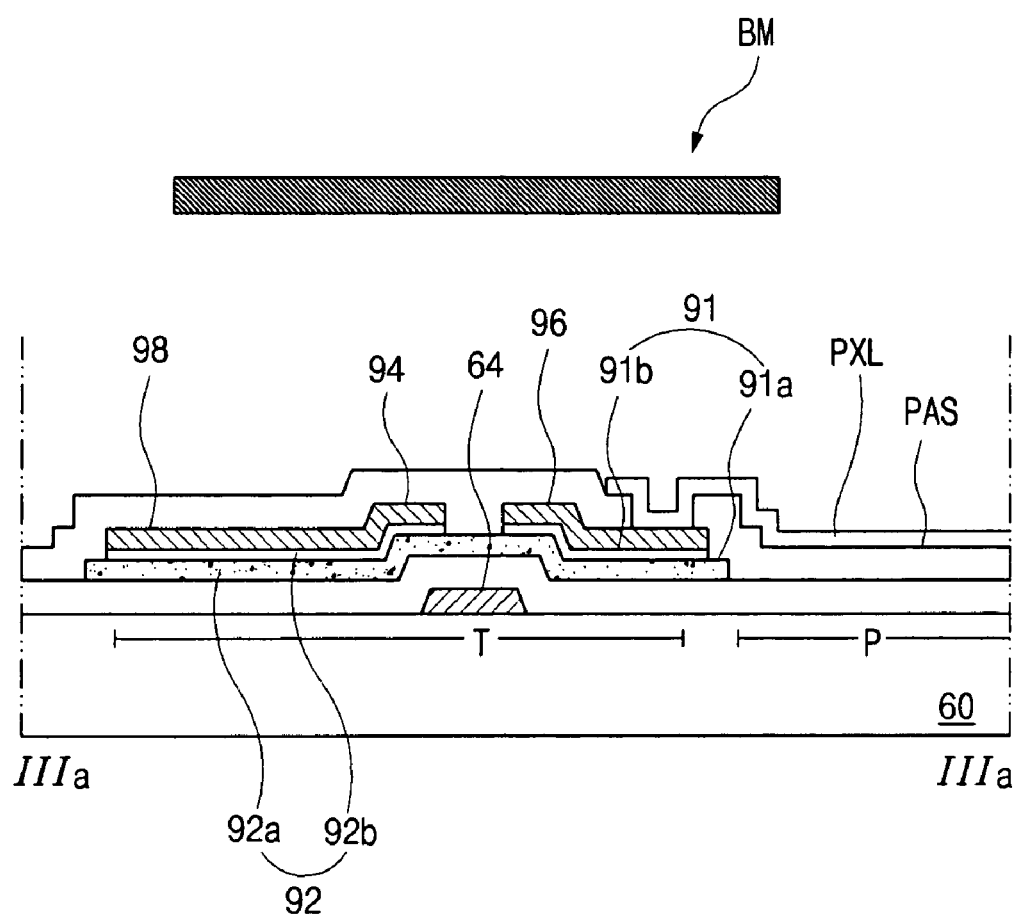

ARRAY SUBSTRATE FOR LIQUID CRYSTAL DISPLAY DEVICE AND METHOD OF FABRICATING THE SAME

The present application claims the benefit of Korean Patent Application No. 2006-0060903 filed in Korea on Jun. 30, 2006, which is hereby incorporated by reference.

BACKGROUND OF THE INVENTION

1. Field of the Invention

The present invention relates to a liquid crystal display (LCD) device and more particularly to an array substrate that reduces wavy noise and damages to an active layer, and a method of fabricating that array substrate.

2. Background of the Related Art

In the related art LCD devices, physical properties of liquid crystal molecules such as an optical anisotropic property and polarization properties are used to display images. The liquid crystal molecules have unique orientation characteristics resulting from their thin and long shape. An arrangement direction of the liquid crystal molecules is controlled by applying an electrical field to them. Accordingly, when the electric field is applied to the liquid crystal molecules, the polarization properties is changed according to the arrangement of the liquid crystal molecules to transmit light, thereby displaying the images on the LCD screen.

The LCD device includes a first substrate, a second substrate and a liquid crystal layer interposed therebetween. A common electrode and a pixel electrode are respectively formed on the first and second substrates. The first and second substrates may be referred to as a color substrate and an array substrate, respectively. The liquid crystal layer is driven by a vertical electric field induced between the common and pixel electrodes. The LCD device has excellent transmittance and aperture ratio.

Among the known types of LCD devices, active matrix LCD (AM-LCD) devices, which have thin film transistors (TFTs) arranged in a matrix form, are the subject of significant research and development because of their high resolution and superior ability in displaying moving images.

FIG. 1 is a schematic view of an LCD device according to the related art. As shown in FIG. 1, the LCD device 51 includes a first substrate 5, a second substrate 10 and a liquid crystal layer (not shown) interposed therebetween. The first and second substrates 5 and 10 are facing each other and spaced apart. A black matrix 6, a color filter layer including sub-color filters 7a, 7b and 7c, and a common electrode 9 are formed on the first substrate 5. The black matrix 6 has a lattice pattern and blocks light that transmits through the second substrate 10. Each of the sub-color filters 7a, 7b and 7c has one of red R, green G and blue B colors and the sub-color filters 7a, 7b and 7c are formed in the lattice patterns. The common electrode 9 of a transparent conductive material is formed on the black matrix 6 and the color filter layer 7.

A gate line 14 and a data line 26 are formed on the second substrate 10. The gate and data lines 14 and 26 intersect each other to define a pixel region P on the second substrate 10. A TFT T is formed in the pixel region P. The TFT T is connected to the gate and data lines 14 and 26. Although not shown, the TFT T includes a gate electrode, a semiconductor layer, a source electrode, and a drain electrode. The gate and source electrodes are connected to the gate line 14 and the data line 26, respectively. The source electrode is spaced apart from the drain electrode. Moreover, a pixel electrode 32 is formed in the pixel region P. And, the pixel electrode 32 is connected to the TFT T. The pixel electrode 32 is formed of a transparent conductive material, such as indium-tin-oxide (ITO) and indium-zinc-oxide (IZO). As mentioned above, an electric field is induced between the common electrode 9 and the pixel electrode 32 to drive the liquid crystal layer (not shown).

The related art method for fabricating an array substrate may includes five or six mask processes. For example, the related art five mask processes include the following steps. In a first mask process, the gate electrode and the gate line are formed on the second substrate. At the same time, a gate pad, which is formed at one end of the gate line, is formed on the second substrate. Then, a gate insulating layer is formed on an entire surface of the second substrate having the gate electrode and the gate line. In a second mask process, the semiconductor layer, which includes an active layer and an ohmic contact layer, is formed on the gate insulating layer. The semiconductor layer corresponds to the gate electrode. In a third mask process, the data line, the source electrode and the drain electrode are formed on the gate insulating layer and the semiconductor layer. The source and drain electrodes corresponds to the semiconductor layer. At the same time, a data pad, which is disposed at one end of the data line, is formed on the gate insulating layer. In a fourth mask process, a passivation layer having a drain contact hole is formed on the data line, the source electrode and the drain electrode. The drain contact hole exposes the drain electrode. In a fifth mask process, the pixel electrode is formed on the passivation layer. The pixel electrode is connected to the drain electrode through the drain contact hole.

Since the array substrate is fabricated through the complicated mask processes, risk of deteriorating some of the component increases and a production yield decreases. In addition, since fabrication time and cost increase, a competitiveness of product is reduced. To resolve these problems in the five mask process, a four mask process is suggested.

FIG. 2 is a plane view of one pixel region of the array substrate fabricated by a related art four mask process. As shown in FIG. 2, the gate line 62 and the data line 98 are formed on the subtrate 60. The gate and data lines 62 and 98 intersect each other to define the pixel region P on the substrate 60. The gate pad 66 is formed at one end of the gate line 62. A transparent gate pad terminal GPT is formed on the gate pad 66 and contacting the gate pad 66. The data pad 99 is formed at one end of the data line 98. A transparent data pad terminal DPT is formed on the data pad 99 and contacting the data pad 99.

A TFT T including a gate electrode 64, a first semiconductor layer 91, a source electrode 94 and a drain electrode 96 is disposed at a respective intersection of the gate and data lines 62 and 98. The gate electrode 64 is connected to the gate line 62 and the source electrode 94 id connected to the data line 98. The source and drain electrodes 94 and 96 are spaced apart from each other on the first semiconductor layer 91. A pixel electrode PXL is formed in the pixel region P and contacts the drain electrode 96.

A metal layer 97 having an island shape and contacting the pixel electrode PXL overlaps a portion of the gate line 62. The portion of the gate line 62 functions as a first storage electrode, the metal layer 97 functions as a second storage electrode, and a gate insulating layer (not shown) formed of a dielectric material disposed between the first and second storage electrodes functions as a storage capacitor Cst.

A second semiconductor layer 92 is formed under the data line 98, and a third semiconductor layer 93 is formed under the metal layer 97. Since the second semiconductor layer 92 extends from the first semiconductor layer 91 in the four mask process, the second semiconductor layer 92 has a same structure as the first semiconductor layer 91. A portion of an active layer of the first semiconductor layer 91 is not covered by the gate electrode 64 and is exposed to light generated from a backlight unit (not shown) under the substrate 60. And a portion of an active layer of the second semiconductor layer 92 is not covered by the data line 98 and is exposed to an ambient light. Namely, the active layer of the second semiconductor layer 92 protrudes beyond the data line 98. Since the active layer of the first semiconductor layer 91 is formed of amorphous silicon, a photo leakage current is generated due to the light from the backlight unit.

As a result, the TFT T is damaged due to the photo leakage current. Moreover, since the active layer of the second semiconductor layer 92 is also formed of amorphous silicon, a leakage current is also generated in the second semiconductor layer 92 due to the ambient light. The light leakage current causes a coupling of signals in the data line 98 and the pixel electrode PXL to generate wavy noise when displaying images. A black matrix (not shown) designed to cover the protruding portion of the second semiconductor layer 92 reduces aperture ratio of the LCD device.

FIGS. 3A and 3B are cross-sectional views taken along lines IIIa-IIIa and IIIb-IIIb of FIG. 2, respectively. As shown in FIGS. 3A and 3B, the first semiconductor layer 91 is formed under the source and drain electrodes 94 and 96. The second semiconductor layer 92 is formed under the data line 98. The second semiconductor layer 92 extends from the first semiconductor layer 91. The first semiconductor layer 91 includes an intrinsic amorphous silicon layer as an active layer 91*a* and an impurity-doped amorphous silicon layer as an ohmic contact layer 91*b*. The second semiconductor layer 92 includes an intrinsic amorphous silicon layer 92*a* and an impurity-doped amorphous silicon layer 92*b*.

As shown in FIG. 3A, the first semiconductor layer 91 is connected to the second semiconductor layer 92, therefore, a portion of the active layer 91*a* can not be completely covered by the gate electrode 64. This portion of the active layer 91*a* is exposed to light generated from the backlight unit (not shown), thus a photo current is generated in the active layer 91*a*. And, this photo current becomes a leakage current in the TFT T and causes an abnormal leakage of voltage in the pixel region P, thereby damaging the TFT T. As shown in FIG. 3A, the active layer 91*a* is exposed through the ohmic contact layer 91*b* and is over-etched to reduce the impurities left on the active layer 91*a*, thus, the active layer 91*a* includes a sufficient thickness. Accordingly, the photo currents are generated in the TFT T and damage the TFT T.

Similarly, as shown in FIG. 3B, a portion of the intrinsic amorphous silicon layer 92*a* of the second semiconductor layer 92 under the data line 98 protrudes beyond the data line 98. When the protruding portion of the intrinsic amorphous silicon layer 92*a* is exposed to light generated from the backlight unit or the ambient light, it is repeatedly turned on and off, thus the light leakage current is generated. The light leakage current is coupled with the signal in the pixel electrode PXL. Accordingly, an arrangement of the liquid crystal molecules is abnormally distorted. Thus, undesired wave-shaped thin lines (a wavy noise) are displayed on screen.

Typically, a distance between the data line 98 and the pixel electrode PXL is approximately 4.75 μm in the related art LCD device fabricated by the five or six mask processes. The intrinsic amorphous silicon layer 92*a* of the second semiconductor layer 92 protrudes beyond the data line 98 by approximately 1.7 μm in the related art LCD device fabricated by the four mask process. Accordingly, a distance D between the data line 98 and the pixel electrode PXL is approximately 6.45 μm (=4.75 um+1.7 um) due to the protrusion of the intrinsic amorphous silicon layer 92*a*. Therefore, the pixel electrode PXL in the related art LCD device of four mask process is farther away from the data line 98 than in the five or six mask processes. In addition, a width W1 of a black matrix BM that shields the data line 98 and the distance D increases in the related art LCD device of four mask process. This increase in the width of the black matrix BM reduces the aperture ratio.

FIGS. 4A to 4G are cross-sectional views showing a related art fabricating process taken along line IIIa-IIIa of FIG. 2. FIGS. 5A to 5G are cross-sectional views showing a related art fabricating process taken along line V-V of FIG. 2. And, FIGS. 6A to 6G are cross-sectional views showing a related art fabricating process taken along line VI-VI of FIG. 2.

FIGS. 4A, 5A and 6A show a first mask process. As shown in FIGS. 4A, 5A and 6A, a gate line 62, a gate pad 66 and a gate electrode 64 are formed on a substrate 60 having a pixel region P, a switching region S, a gate pad region GP, a data pad region DP and a storage region C through a first mask process. The gate pad 66 is formed at one end of the gate line 62. The gate electrode 64 is connected to the gate line 62 and disposed in the switching region S. The gate pad 66 is disposed in the gate pad region GP. The gate line 62, the gate pad 66 and the gate electrode 64 are formed by depositing and patterning a first metal layer (not shown) using a first mask (not shown) as a pattering mask. The first metal layer includes material selected from conductive metallic material group having aluminum (Al), aluminum alloy (AlNd), tungsten (W), chromium (Cr), and molybdenum (Mo). The first metal layer may have a double-layered structure.

FIGS. 4B to 4E, 5B to 5E and 6B to 6E show a second mask process. As shown in FIGS. 4B, 5B and 6B, a gate insulating layer 68, an intrinsic amorphous silicon layer 70, an impurity-doped amorphous silicon layer 72 and a second metal layer 74 are formed on the substrate 60 having the gate line 62. The gate insulating layer 68 is formed of an inorganic insulating material or an organic insulating material. The inorganic insulating material may include one of silicon nitride and silicon oxide, and the organic insulating material may include one of benzocyclobuene (BCB) and acrylate resin. The second metal layer 74 includes material selected from conductive metallic material group having aluminum (Al), aluminum alloy (AlNd), tungsten (W), chromium (Cr), and molybdenum (Mo). The second metal layer 74 may have a double-layered structure.

A photoresist (PR) layer 76 is formed on the second metal layer 74. A second mask M is disposed over the photoresist layer 76. The second mask M has a transmitting portion B1, a blocking portion B2 and a half-transmitting portion B3. The transmitting portion B1 includes a relatively high light transmittance so that light through the transmitting portion B1 can change the chemical property of the PR layer completely. The blocking portion B2 shields light completely. The half-transmitting portion B3 includes a slit structure or a half-transmitting film. Accordingly, an intensity of light transmitting through the half-transmitting portion B3 can be lowered. As a result, light transmittance at the half-transmitting portion B3 is smaller than that of the transmitting portion B1 and is greater than that of the blocking portion B2.

A portion of second mask M where the half-transmitting portion B3 is sandwiched by two blocking B2 correspond to the switching region S on the substrate 60. The transmitting portion B1 corresponds to the gate pad region GP and the pixel region P, and the blocking portion B2 corresponds to the storage region C and the data pad region DP. The PR layer 76 is exposed to light transmitting through the second mask M.

Next, as shown in FIGS. 4C, 5C and 6C, first to third PR patterns 78a, 78b and 78c are formed in the switching region S, the data pad region DP and the storage region C, respectively. And, the second metal layer 74 is exposed by the first to third PR patterns 78a, 78b and 78c. The first PR pattern 78a has a step-like structure that a height of the first PR pattern 78a at a center portion is lowered due to the half-transmitting portion B3 of the second mask M. The second metal layer 74, the impurity-doped amorphous silicon layer 72 and the intrinsic amorphous silicon layer 70 are etched using the first to third PR patterns 78a to 78c as an etching mask. The second metal layer 74, the impurity-doped amorphous silicon layer 72 and the intrinsic amorphous silicon layer 70 are all etched simultaneously or etched individually depending on the metallic material of the second metal layer 74.

As shown in FIGS. 4D, 5D and 6D, first to third metal patterns 80, 82 and 86 are formed under the first to third PR patterns 78a, 78b and 78c, and first to third semiconductor patterns 90a, 90b and 90c are formed under the first to third metal patterns 80, 82 and 86. The second metal pattern 82 extends from the first metal pattern 80, and the third metal pattern 86 having an island shape is formed in the storage region C. The first to third semiconductor patterns 90a, 90b and 90c include an intrinsic amorphous silicon pattern 70a and an impurity-doped amorphous silicon pattern 72a.

Next, the first to third PR patterns 78a, 78b and 78c are ashed such that the center portion of the first PR pattern 78a is removed to expose the first metal pattern 80. In addition, peripheral portions of the first to third PR patterns 78a, 78b and 78c are removed simultaneously. Accordingly, the first to third PR patterns become fourth to sixth PR patterns 79a, 79b and 79c exposing the first to third metal patterns 80, 82 and 86, respectively.

As shown in FIGS. 4E, 5E and 6E, the first to third metal patterns 80, 82 and 86 and the impurity-doped amorphous silicon layer 72a are etched using the fourth to sixth PR patterns 79a to 79c. The first metal pattern 80 (of FIG. 4D) in the switching region S is etched to form source and drain electrodes 94 and 96, the second metal pattern 82 (of FIG. 6D) in the data pad region DP is etched to form a data line 98 and a data pad 99, and the third metal pattern 86 (of FIG. 4D) in the storage region C is etched to form a metal layer 97. The intrinsic amorphous silicon layer 70a (of FIG. 4D) and the impurity-doped amorphous silicon layer 72a (of FIG. 4D) of the first semiconductor pattern 90a (of FIG. 4D) are etched to form an active layer 91a and an ohmic contact layer 91b, respectively. The active layer 91a and the ohmic contact layer 91b forms a first semiconductor layer 91. The active layer 91a is exposed through the ohmic contact layer 91b. The active layer 91a is also over-etched such that the impurities are removed from the active layer 91a.

In addition, the second and third semiconductor patterns 90b and 90c (of FIGS. 6D and 4D) are etched to form second and third semiconductor layers 92 and 93, respectively. An overlapped portion of the gate line 62 (first storage electrode) and the metal layer 97 (second storage electrode) forms the storage capacitor Cst with the gate insulating layer 68. Thereafter, the fourth to sixth PR patterns 79a, 79b and 79c are removed.

FIGS. 4F, 5F, and 6F show a third mask process. A passivation layer PAS is formed on the substrate 60 having the data line 98. The passivation layer PAS is patterned using a third mask (not shown) to form a drain contact hole CH1 exposing the drain electrode 96, a storage contact hole CH2 exposing the metal layer 97, and a data pad contact hole CH4 exposing the data pad 99. Furthermore, the passivation layer PAS and the gate insulating layer 68 are patterned using the third mask (not shown) to form a gate pad contact hole CH3 exposing the gate pad 66.

FIGS. 4G, 5G and 6G show a fourth mask process. A transparent conductive material is deposited on the passivation layer PAS and patterned through a fourth mask (not shown) to form a pixel electrode PXL, a gate pad terminal GPT and a data pad terminal DPT. The pixel electrode PXL contacts the drain electrode 96 within the drain contact hole CH1 and the metal layer 97 within the storage contact hole CH2. The gate pad terminal GPT contacts the gate pad 66 within the gate pad contact hole CH3, and the data pad terminal DPT contacts the data pad 99 within the data pad contact hole CH4.

Through the above four mask process, the related art array substrate is fabricated. Production costs and production time are saved by the related art four mask process. However, since the intrinsic amorphous silicon layer of the second semiconductor layer protrudes beyond the data line, noise is generated and the aperture ratio is reduced. In addition, since the active layer is connected to the intrinsic amorphous silicon layer of the second semiconductor layer, a portion of the active layer is not covered by the gate electrode. Accordingly, the light leakage current is generated in the thin film transistor. Furthermore, because a thick active layer should be formed in consideration of the over-etching, fabrication time and product cost increase. Moreover, the related art array substrate fabricated by the fourth mask process requires a black matrix having a width greater than that of the five mask process, aperture ratio is further reduce.

SUMMARY OF THE INVENTION

Accordingly, the present invention is directed to an array substrate for a liquid crystal display device and a method of fabricating the same that substantially obviates one or more of the problems due to limitations and disadvantages of the related art.

An object of the present invention is to provide a four mask fabricating process that prevents generation of wavy noise and light leakage current while improving the aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes a gate line and a data line on a substrate intersecting each other, the data line includes a first layer formed of a transparent conductive material and a second layer under the first layer; a thin film transistor including a gate electrode connected to the gate line formed at respective intersection of the gate and data lines, an insulating layer on the gate electrode, an active layer on the insulating layer and disposed within the gate electrode, an etch stopper on the active layer, an ohmic contact layer on the etch stopper, a source electrode on the ohmic contact layer and connected to the first layer, a drain electrode spaced apart from the source electrode; and a pixel electrode connected to the drain electrode, wherein the source electrode, the drain electrode and the pixel electrode are formed of the same layer and the same material as the first layer.

In another aspect, a method of fabricating an array substrate for a liquid crystal display device includes forming a gate electrode and gate line on a substrate, the gate line connected to the gate electrode; sequentially disposing a first insulating layer, an intrinsic amorphous silicon layer and a second insulating layer on the gate electrode and the gate line; etching the second insulating layer to form an etch stopper; sequentially disposing an impurity-doped amorphous silicon layer and a conductive metal layer on the etch stopper; etching the conductive metal layer, the impurity-doped amorphous silicon layer and the intrinsic amorphous silicon layer to form an active layer disposed within the gate electrode, an ohmic contact pattern, and a first data pattern, the active layer disposed under the etch stopper, the ohmic contact pattern disposed on the etch stopper; and forming a pixel electrode, a second data pattern on the first data pattern, a source electrode, a drain electrode and an ohmic contact layer, the pixel electrode connected to the drain electrode on the ohmic contact layer, the second data pattern connected to the source electrode on the ohmic contact layer, the drain electrode spaced apart from the source electrode, wherein each of the pixel electrode, the second data pattern, the source electrode and the drain electrode is formed of a transparent conductive material and the first and second data patterns form a data line that intersects the gate line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 3A and 3B are cross-sectional views taken along lines IIIa-IIIa and IIIb-IIIb of FIG. 2;

FIGS. 12A to 12K, 13A to 13K and 14A to 11K are cross-sectional views taken along lines VIIIa-VIIIa, VIIIb-VIIIb and VIIIc-VIIIc of FIG. 7, respectively, showing a second exemplary fabrication processes of an array substrate for an LCD device according to the exemplary embodiment of the present invention.

DETAILED DESCRIPTION OF THE PREFERRED EMBODIMENTS

Reference will now be made in detail to the preferred embodiments, examples of which are illustrated in the accompanying drawings.

Figure 1:
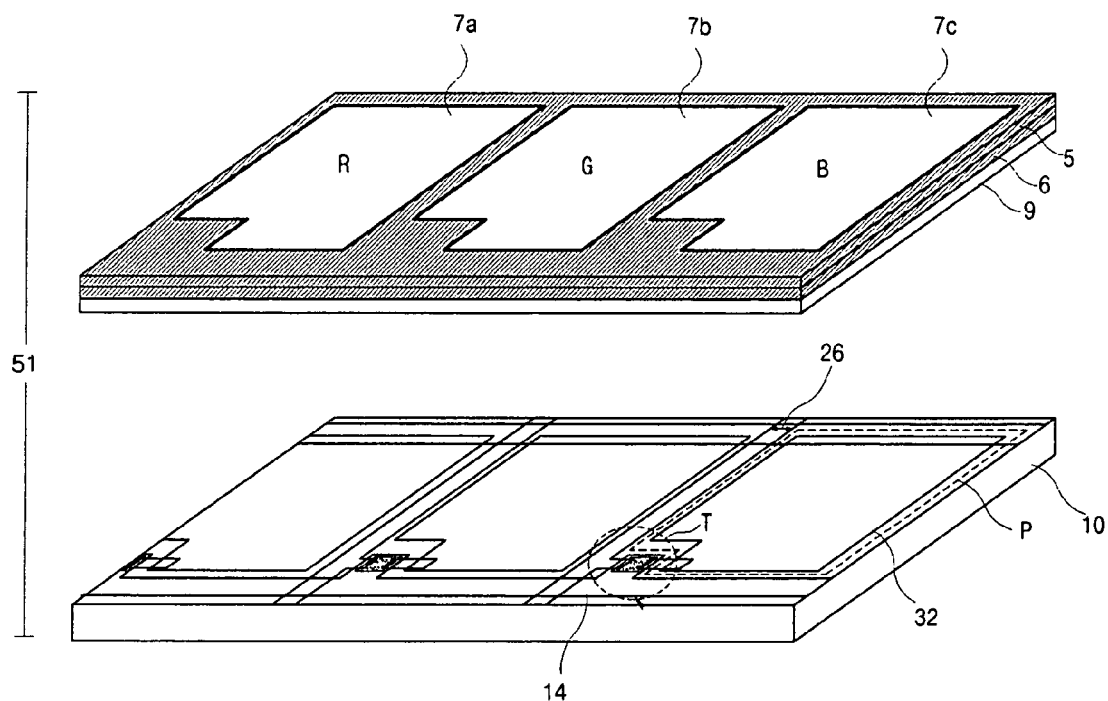
FIG. 1 is a schematic view of a related art LCD device.
Figure 2:
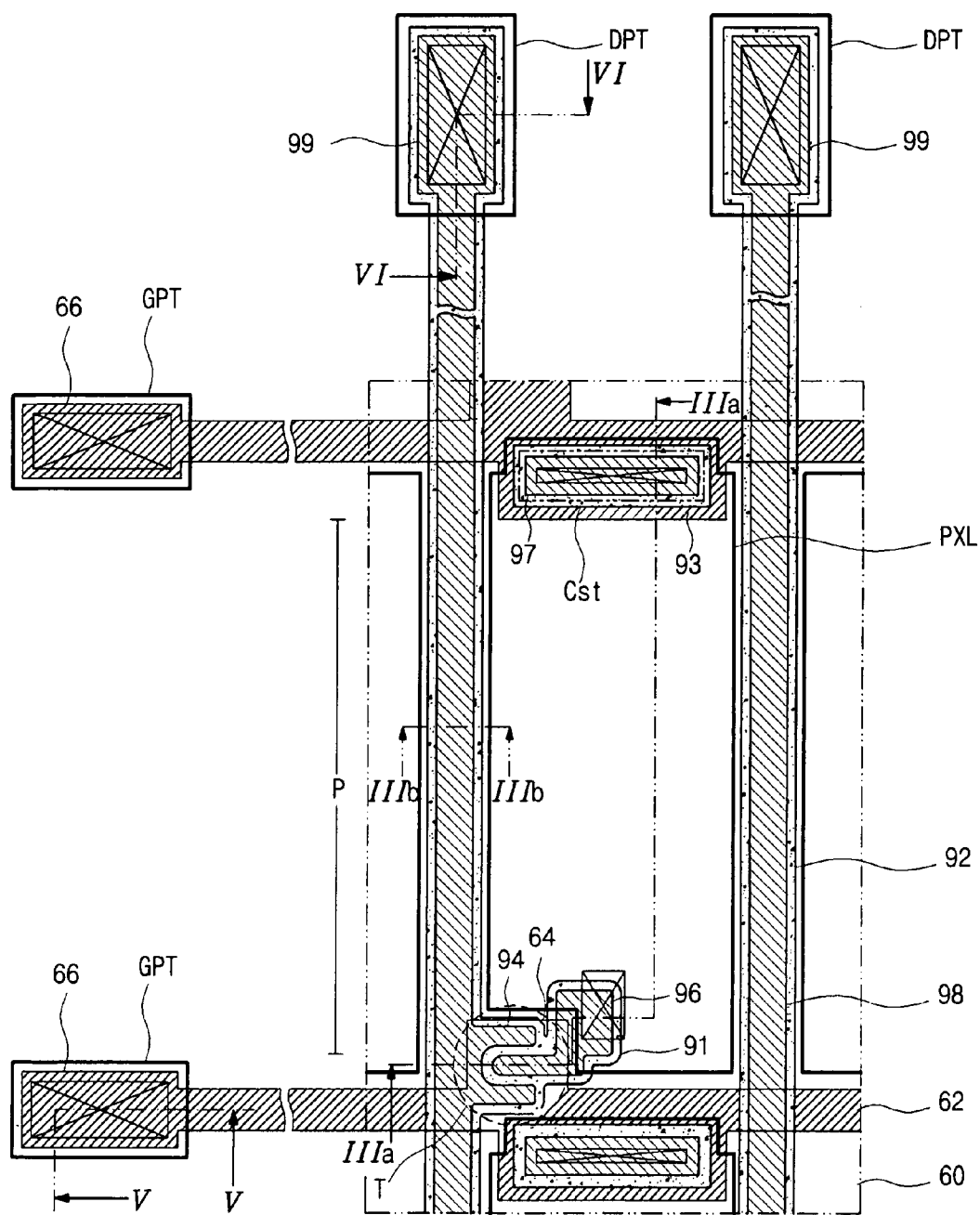
FIG. 2 is a plane view showing a related art array substrate fabricated by a four mask process.
Figure 3B:
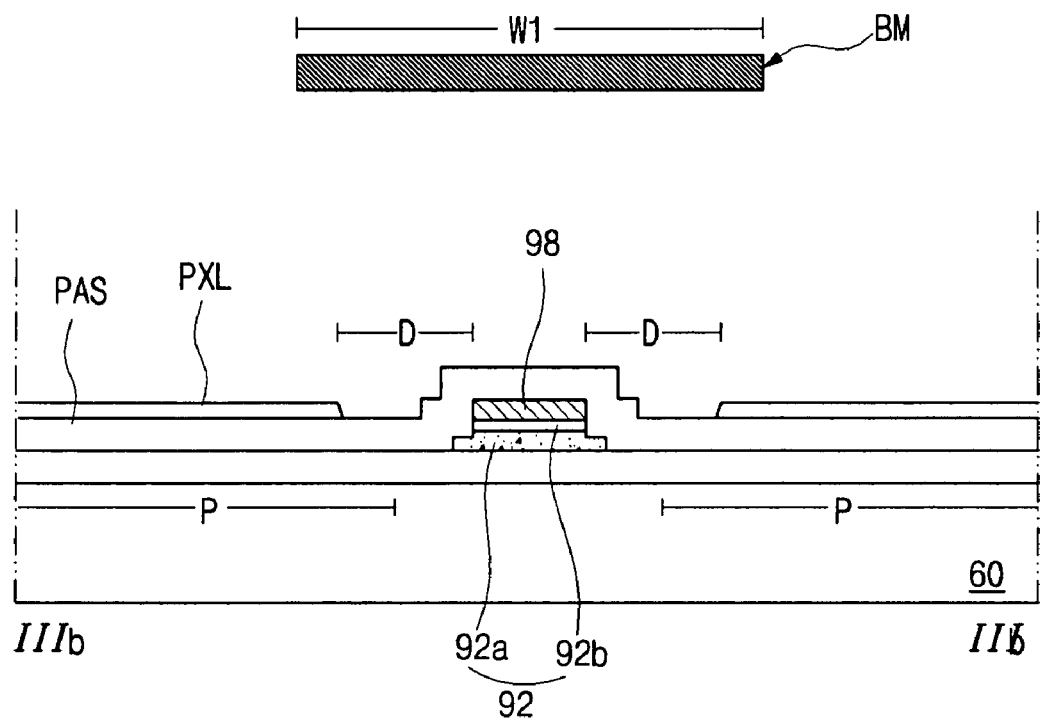
Figure 4A:
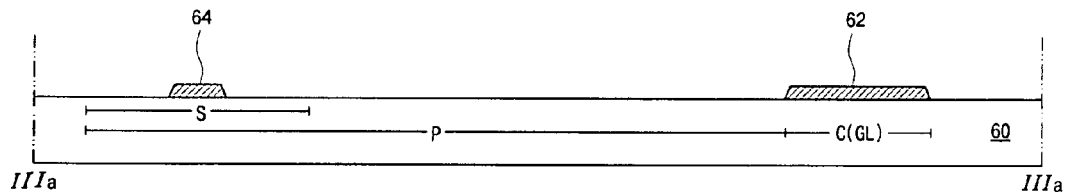
FIGS. 4A to 4G are cross-sectional views showing related art fabricating processes taken along line IIIa-IIIa of FIG. 2.
Figure 4B:
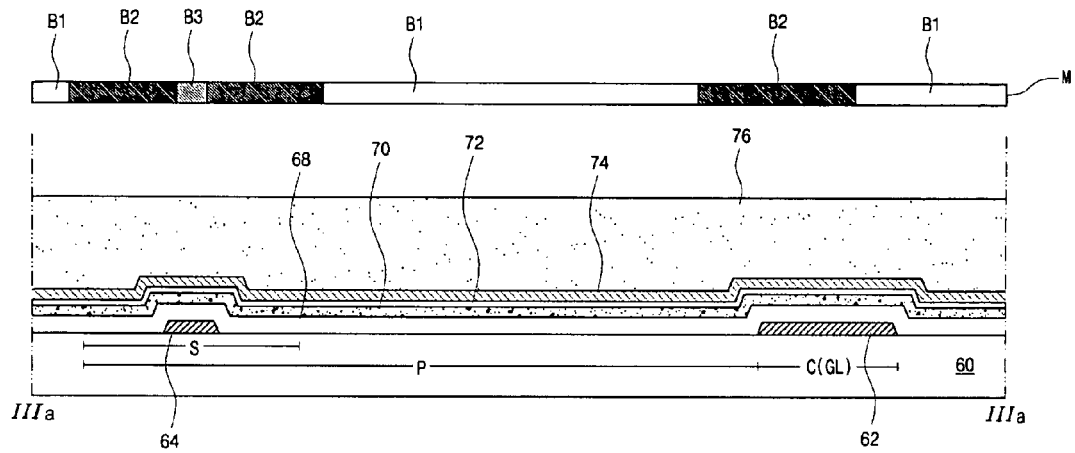
Figure 4C:
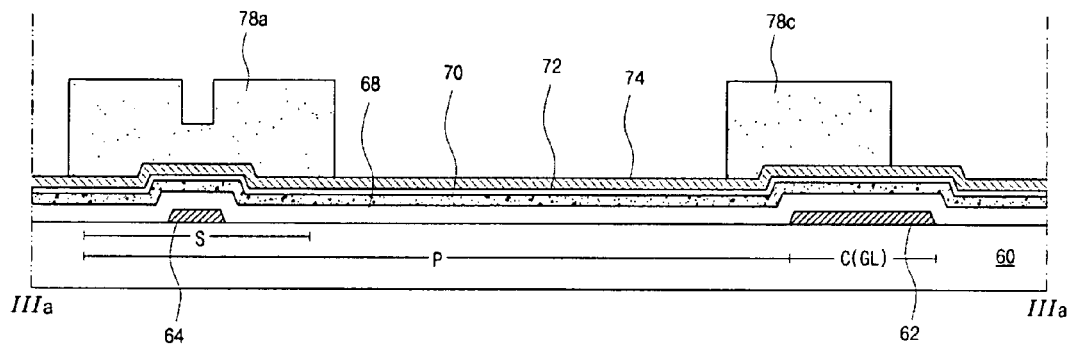
Figure 4D:
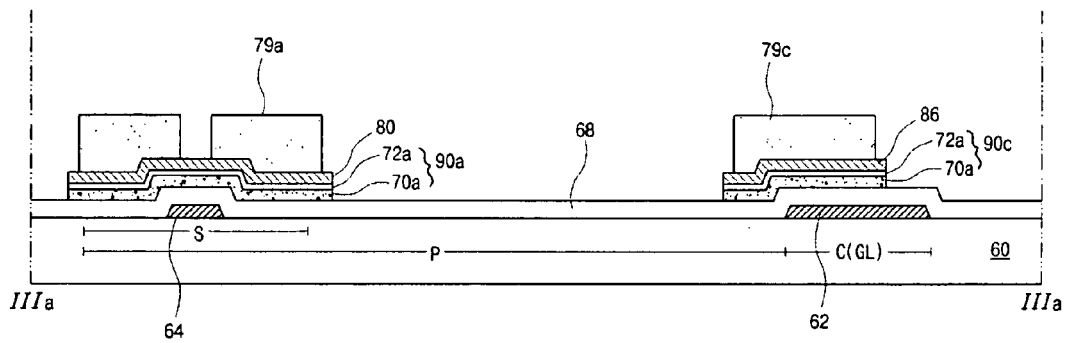
Figure 4E:
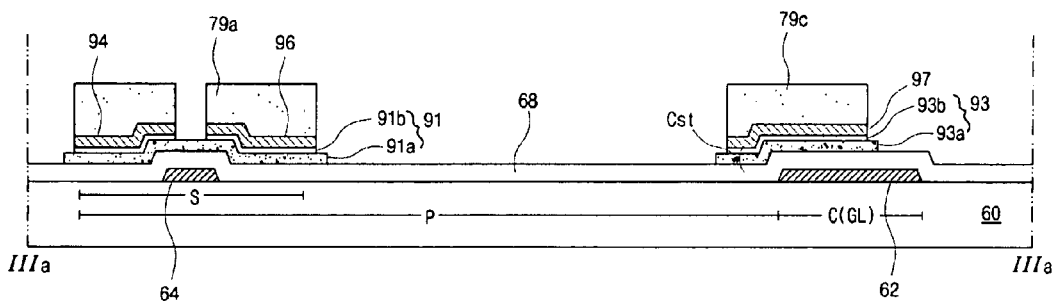
Figure 4F:
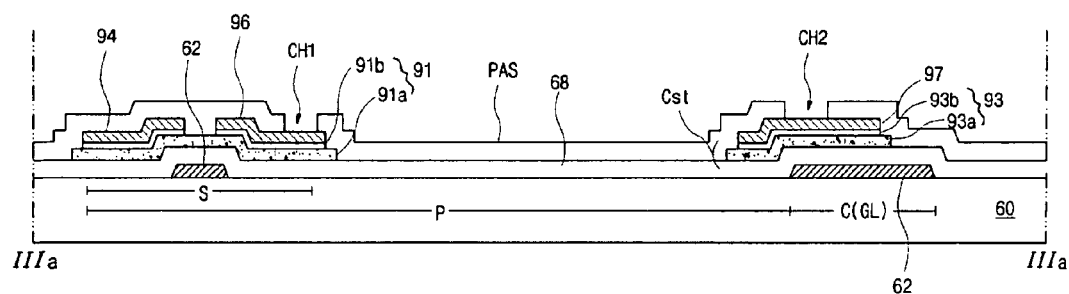
Figure 4G:
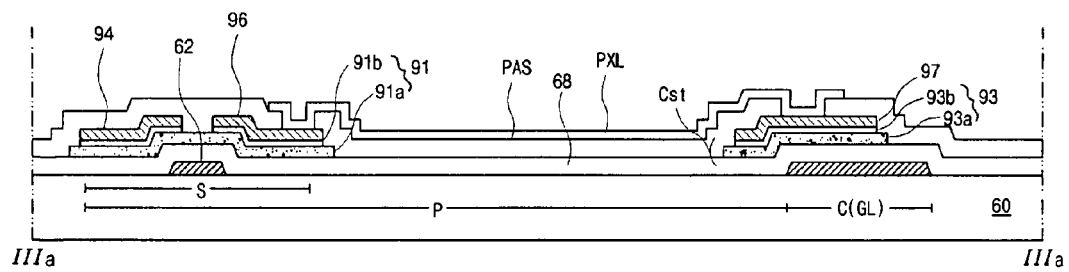
Figure 5A:
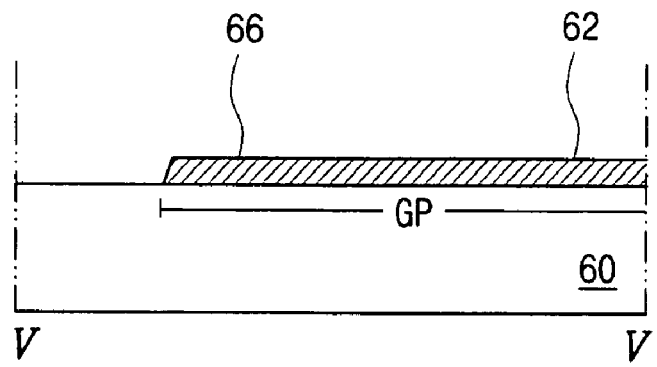
FIGS. 5A to 5G are cross-sectional views showing related art fabricating processes taken along line V-V of FIG. 2.
Figure 5B:
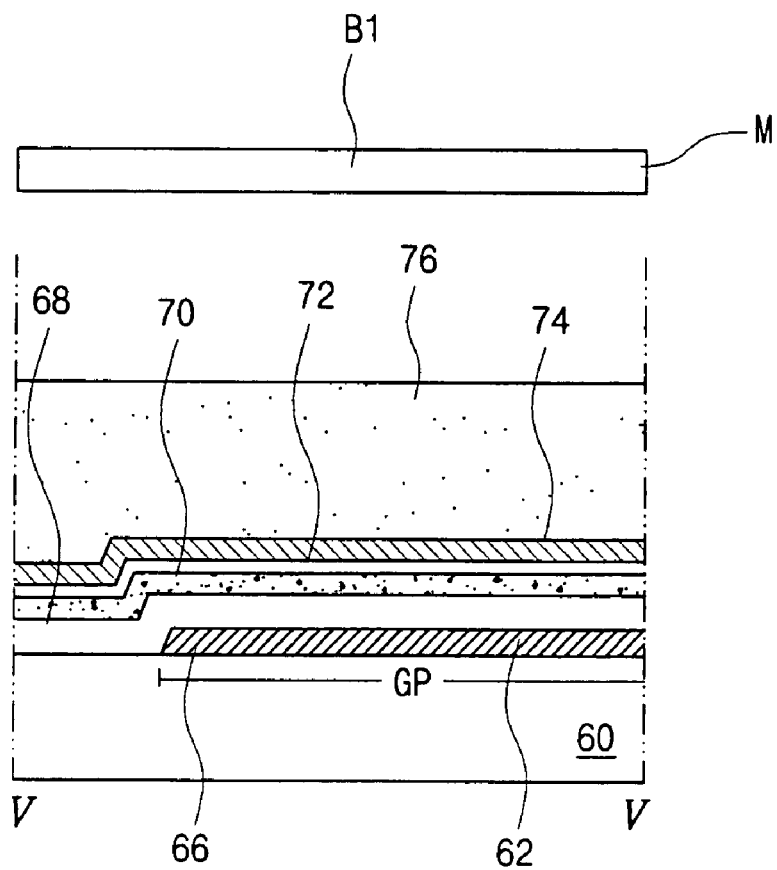
Figure 5C:
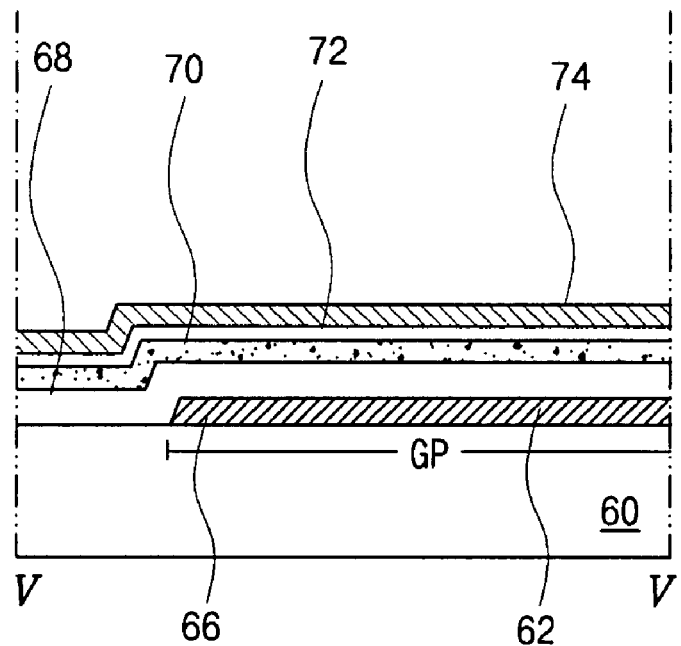
Figure 5D:
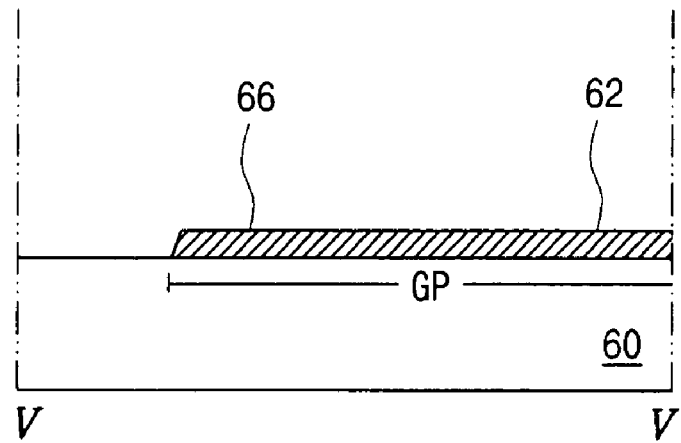
Figure 5E:
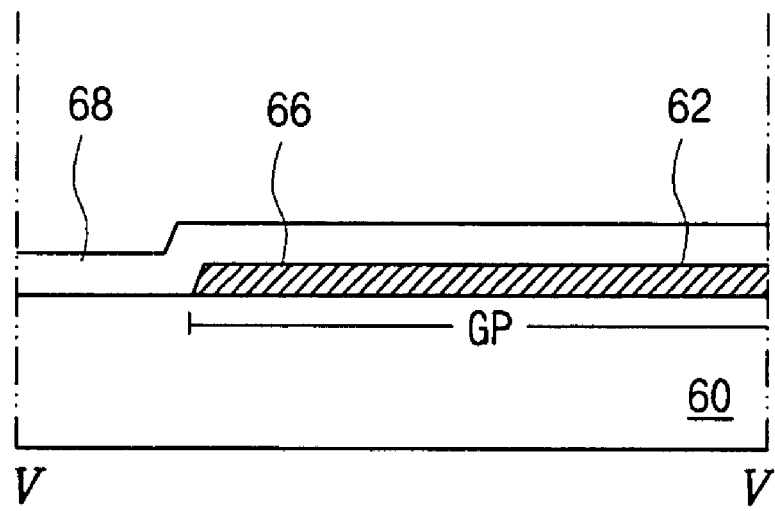
Figure 5F:
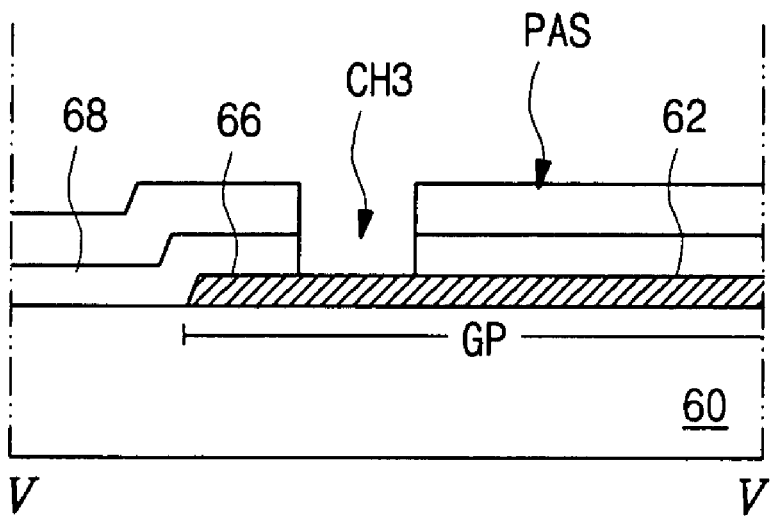
Figure 5G:
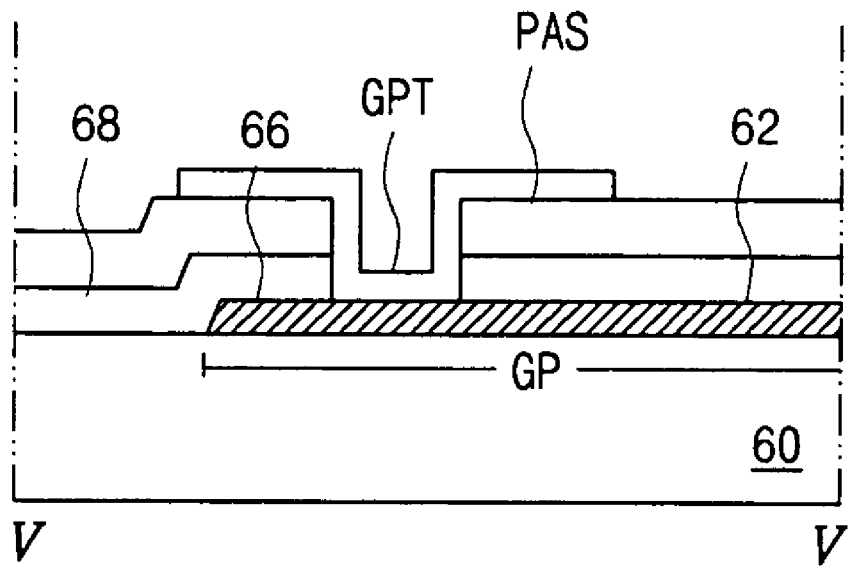
Figure 6A:
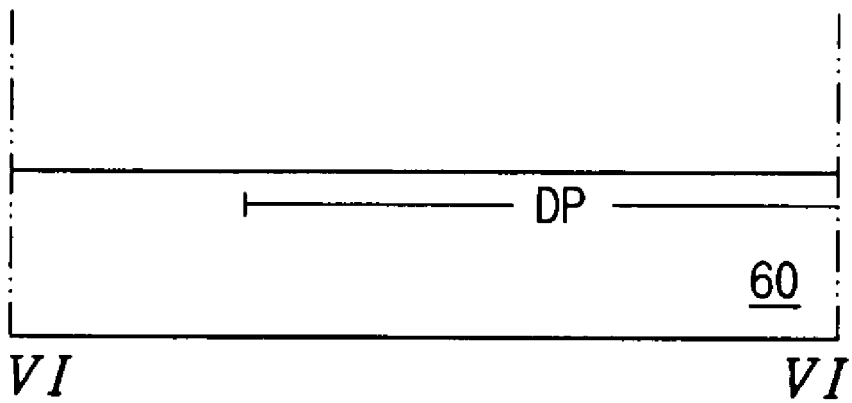
FIGS. 6A to 6G are cross-sectional views showing related art fabricating processes taken along line VI-VI of FIG. 2.
Figure 6B:
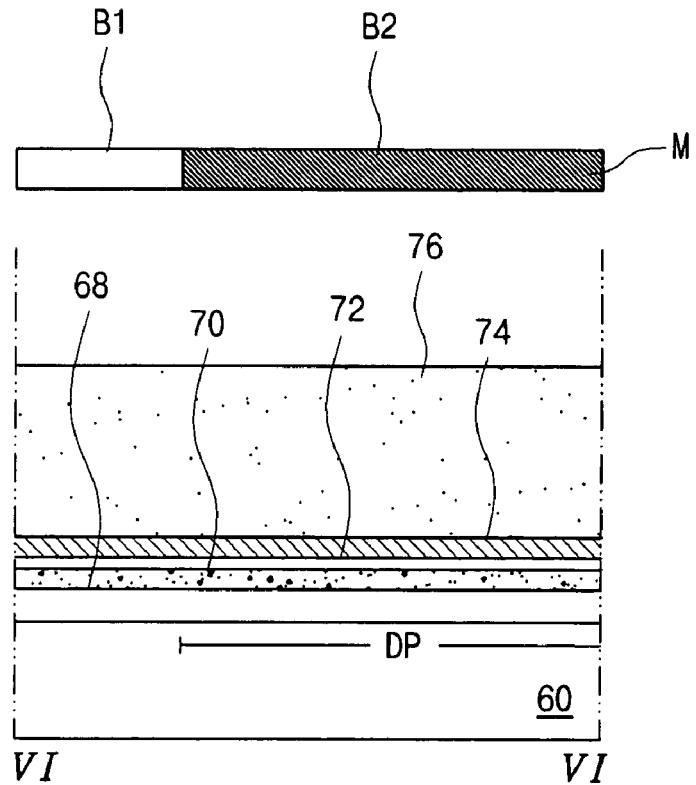
Figure 6C:
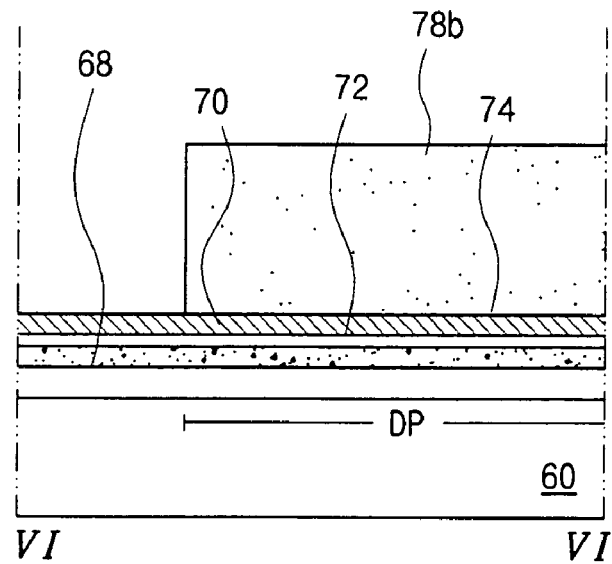
Figure 6D:
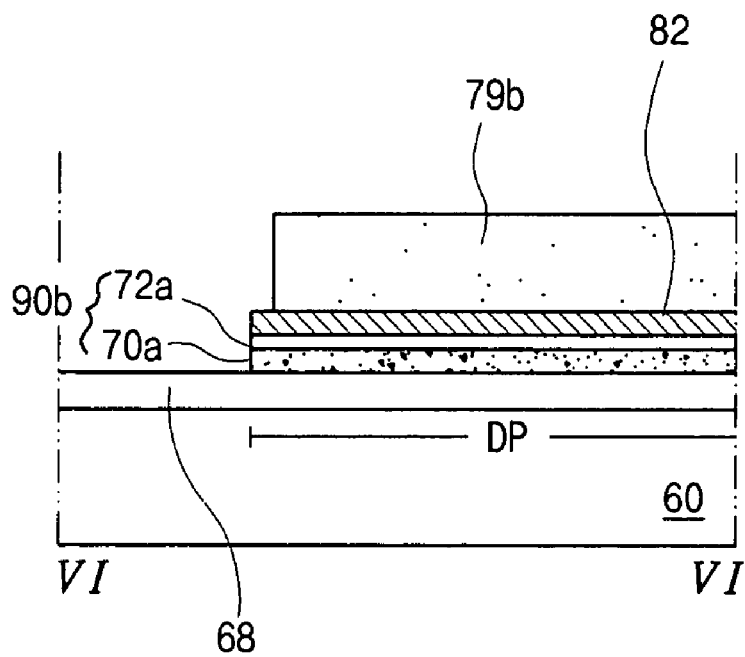
Figure 6E:
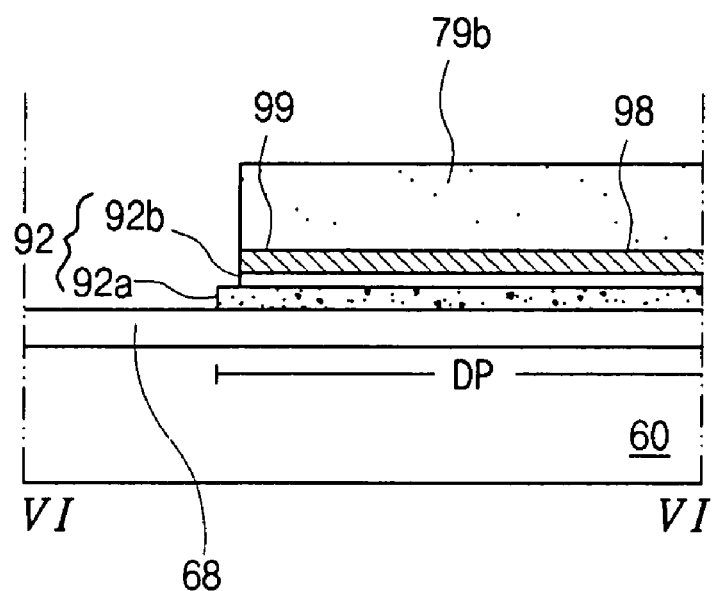
Figure 6F:
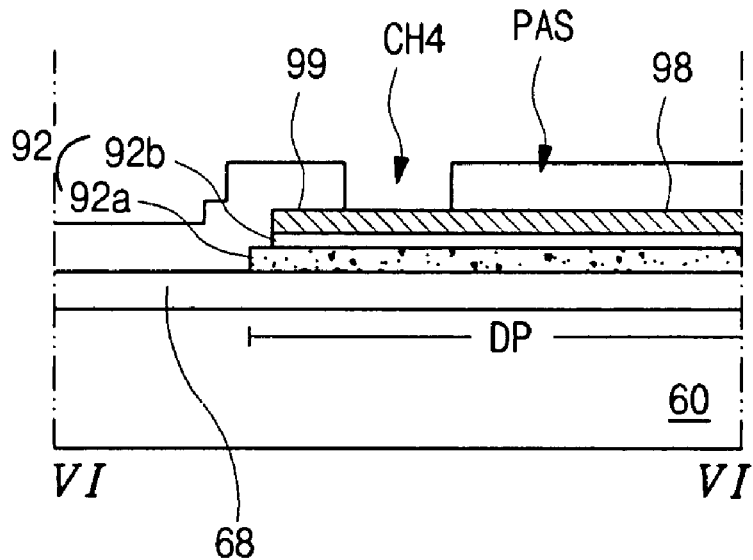
Figure 6G:
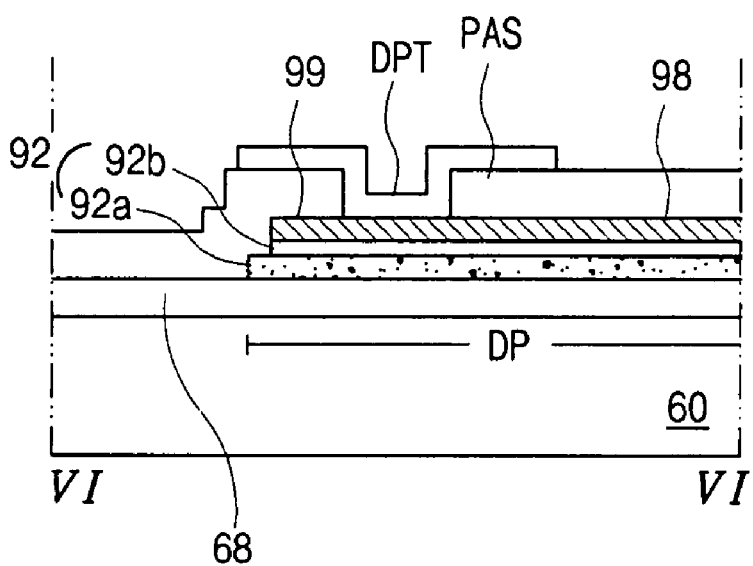
Figure 7:
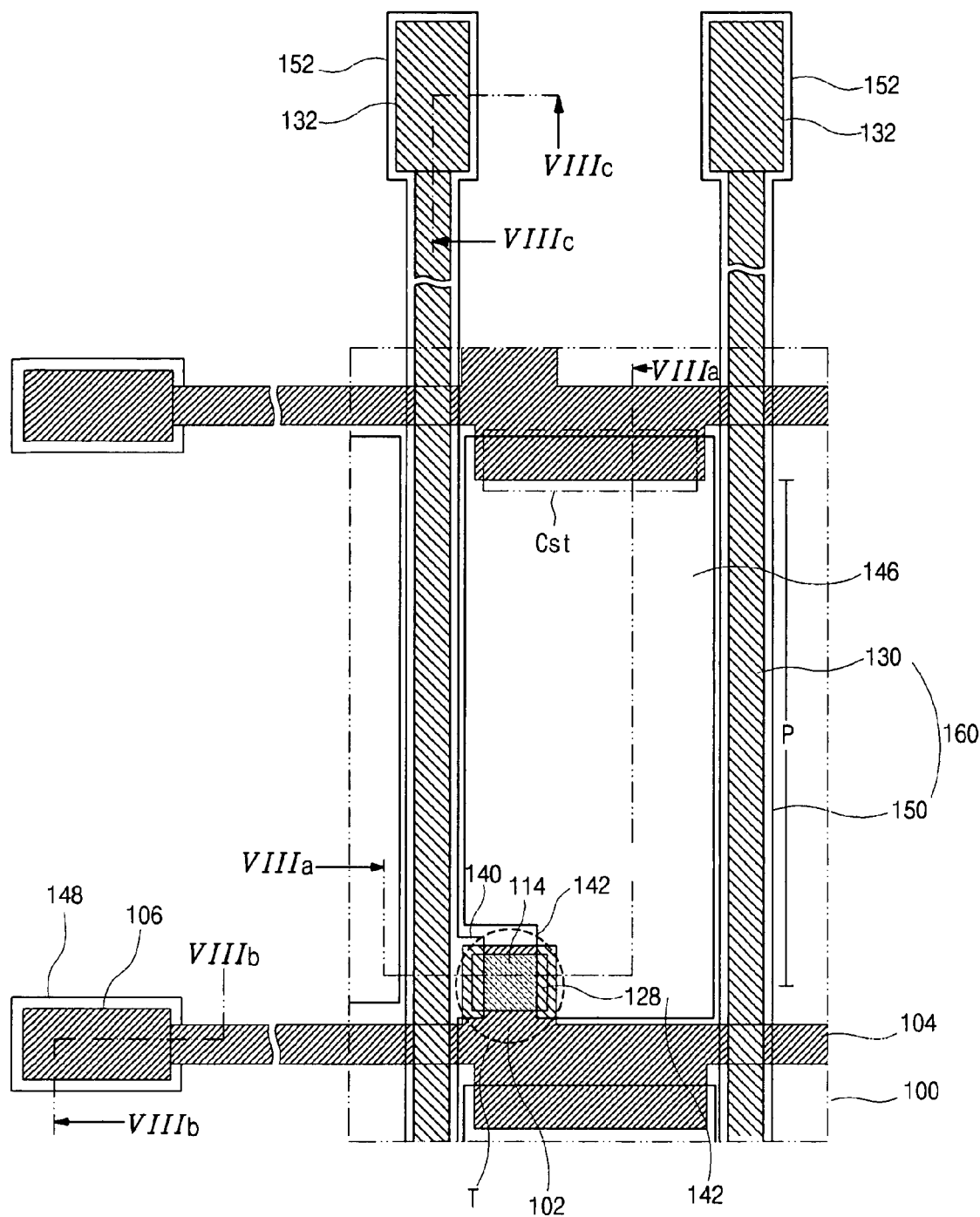
FIG. 7 is a plane view showing an array substrate according to an exemplary embodiment of the present invention.

FIG. 7 is a plane view showing an exemplary array substrate according to an exemplary embodiment of the present invention. The exemplary array substrate is fabricated through a four mask process including an active layer having an island shape on the gate electrode and an etch stopper on the active layer.

As shown in FIG. 7, a gate line 104 and a data line 160 intersect each other on a substrate 100 to define a pixel region P. The data line 160 includes a first data layer 125 (not shown in FIG. 7), a second data layer 127 (not shown in FIG. 7), a third data layer 130 and a fourth data layer 150. A gate pad 106 and a data pad 132 are formed at one end of the gate line 104 and the data line 160, respectively. A gate pad terminal 148 is formed on the gate pad 106 and contacts the gate pad 106. A data pad terminal 152 is formed on the data pad 132 and contacts the data pad 132. The data pad 132 is formed of the same layer and the same material (opaque metal material) as the third layer 130. The data pad terminal 152 is formed of the same layer and the same material (transparent conductive material) as the fourth layer 150.

A TFT T is formed at a respective intersection of the gate and data lines 104 and 106 in the pixel region P. The TFT T is connected to the gate line 104 and the data line 160. The TFT T includes a gate electrode 102, an active layer (not shown), an ohmic contact layer (not shown), a buffer metal layer 128, an etch stopper 114, a source electrode 140 and a drain electrode 142. The gate electrode 102 is connected to the gate line 104 and the source electrode 140 is connected to the data line 160. The buffer metal layer 128 is formed between the ohmic contact layer and the source and drain electrodes 140 and 142. The source electrode 140 is spaced apart from the drain electrode 142. The etch stopper 114 is formed on the active layer (not shown) between the source and drain electrodes 140 and 142. The source electrode 140 is formed of the same layer and the same material (transparent conductive material) as the fourth data layer 150.

A pixel electrode 146 is connected to and extends from the drain electrode 142. The pixel electrode 146 is disposed in the pixel region P. The pixel electrode 146 is formed of the same layer and the same material as the drain electrode 142. The gate line 104 includes an extended portion in the pixel region and the pixel electrode 146 extends and overlaps this extended portion of the gate line 104 to form a storage capacitor Cst. A portion of the gate line 104 overlapping the pixel electrode 146 functions as a first storage electrode. A portion of the pixel electrode 146 overlapping the gate line 104 functions as a second storage electrode. A first insulating layer (not shown) is interposed between the first and second storage electrodes and functions as a dielectric material layer. The first electrode, the second electrode and the dielectric material layer form the storage capacitor Cst. The above-mentioned exemplary array substrate fabricated through the four mask process is different from the related art array substrate that a semiconductor layer does not exist under the data line 160.

Figure 8A:
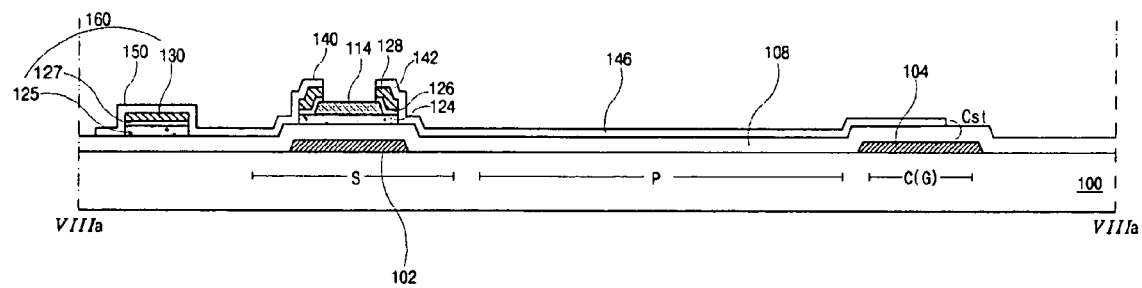
FIGS. 8A to 8C are cross-sectional views taken along lines VIIIa-VIIIa, VIIIb-VIIIb and VIIIc-VIIIc of FIG. 7.
Figure 8B:
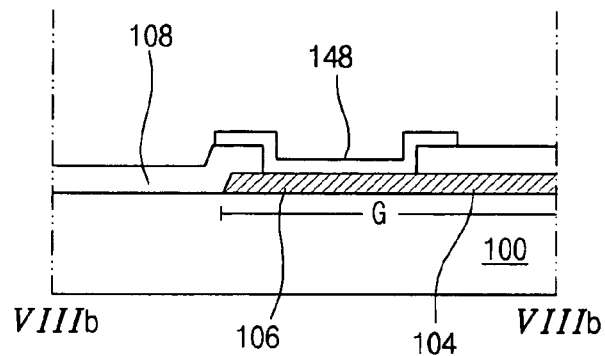
Figure 8C:
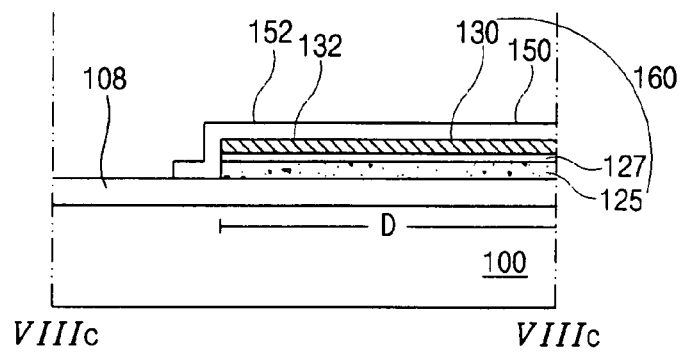

FIGS. 8A to 8C are cross-sectional views taken along lines VIIIa-VIIIa, VIIIb-VIIIb and VIIIc-VIIIc of FIG. 7, respectively. FIG. 8A shows a switching region, a pixel region and a storage region. FIG. 8B shows a gate region, and FIG. 8C shows a data region. As shown in FIGS. 8A to 8C, a pixel regions P, a gate region G and a data region D are defined on the substrate 100. Each pixel region P includes a switching region S where a TFT is formed. The data line and the data pad are formed in the data region D. And, a portion of the gate line region G is defined as a storage region C where a storage capacitor is formed.

The switching region is explained. As discussed earlier, the TFT in the switching region S includes a gate electrode 102, a first insulating layer 108, an active layer 124, an ohmic contact layer 126, a buffer metal layer 128, an etch stopper 114, the source electrode 140 and the drain electrode 142. The gate electrode 102 is formed on the substrate 100 and extends from the gate line 104. The first insulating layer 108 is formed on the gate electrode 102. The active layer 124 formed of intrinsic amorphous silicon is disposed on respective portions of the first insulating layer 108. The active layer 124 has an island shape and is disposed within the gate electrode 102. The active layer 124 has a width equal to or less than that of the gate electrode 102. The etch stopper 114 is formed on the active layer 124. The ohmic contact layer 126 formed of impurity-doped amorphous silicon is disposed on the active layer 124 and the etch stopper 114.

As shown in FIG. 8A, the etch stopper 114 has a width less than the active layer 124. And the ohmic contact layer 126 is formed on the active layer 124 and the etch stopper 114 contacting both. The buffer metal layer 128 is disposed over the ohmic contact layer 126 and the source electrode 140 the drain electrode 142 are formed over the buffer metal layer 128. Accordingly, the source electrode 140 and the drain electrode 142 are connected to the ohmic contact layer 126 through the buffer metal layer 128. Since the source and drain electrodes 140 and 142 are formed of a transparent conductive material and have relatively high resistance, the buffer metal layer 128 is disposed under the source and drain electrodes 140 and 142 to reduce the resistance between electrodes 140 and 142 and the ohmic contact layer 126. As shown in FIG. 8A, the source and drain electrodes 140 and 142 are spaced apart from each other, however the active layer 124 is not exposed because of the etch stopper 114.

The pixel region is explained. The pixel electrode 146 in the pixel region P is formed on the first insulating layer 108. The pixel electrode 146 is connected to the TFT and extends from the drain electrode 142. The pixel electrode 146 extends to the storage region C and overlaps the gate line 104. The storage capacitor Cst is formed of the first storage electrode, the second storage electrode and the first insulating layer (dielectric material layer).

The gate region G is explained. As shown in FIG. 8B, the gate line 104, the gate pad 106 and the gate pad terminal 148 are formed in the gate region G. The gate line 104 extends from the gate electrode 102 and the gate pad 106 is formed at one end of the gate line 104. The first insulating layer 108 is formed on the gate line 104 and a portion of the gate pad 106. The remaining portion of the gate pad 106 is exposed. The gate pad terminal 148 formed of a transparent conductive material is provided over the first insulating layer 108 and the exposed portion of the gate pad 106.

The data region D is explained. The data line 160, the data pad 132 and the data pad terminal 152 are formed in the data region D. The data line 160 is connected to the source electrode 140. The data pad 132 and the data pad terminal 152 are contacting each other and both are formed at one end of the data line 160. The data line 160 has first to fourth data layers 125, 127, 130 and 150. The first data layer 125 is formed of intrinsic amorphous silicon, the second data layer 127 is formed of impurity-doped amorphous silicon, the third data layer 130 is formed of an opaque metal material, and the fourth data layer 150 is formed of a transparent conductive material. In addition, the first data layer 125 is formed of same layer as the active layer 124, the second data layer 127 is formed of same layer as the ohmic contact layer 126, the third data layer 130 is formed of same layer as the buffer metal layer 128, and the fourth data layer 150 is formed of same layer as the source electrode 140.

As shown in FIG. 8C, the first to third data layers 125, 127 and 130 have the same shape and the same width. The fourth data layer 150 has a width greater than the first to third data layers 125, 127 and 130 such that the fourth data layer 150 covers an upper surface of the third data layer 130 and side surfaces of the first to third data layers 125, 127 and 130. The data pad 132 is formed extending from the third data layer 130 (opaque metal material), and the data pad terminal 152 is formed extending from the fourth data layer 150 (transparent conductive material).

As mentioned above, since the active layer 124 in the exemplary array substrate is disposed within the gate electrode 102, the gate electrode 102 shields light generated from a backlight unit (not shown) positioned under the array substrate. Therefore, the active layer 124 is not exposed to light and no light leakage current is generated in the TFT. In addition, since the source and drain electrodes 140 and 142 are formed of a transparent conductive material, light generated from the backlight unit (not shown) can not be irradiated into the active layer 124. Furthermore, the source and drain electrodes may be formed of the opaque metal layer. When the source and drain electrodes 140 and 142 are formed of the opaque metal layer, light from the backlight unit is reflected on the source and drain electrodes and is not irradiated into the active layer 124.

Moreover, if the third data layer 130 is damaged or broken during the fabricating process, the data line 160 has no disconnecting problem because of the fourth data layer 150 formed on the third data layer 130. In addition, the fourth data layer 150 covers both the upper surface of the third data layer 130 and side surfaces of the first to third data layers 125, 127 and 130, a photo leakage current is perfectly prevented.

Damage to the active layer 124 is also prevented by the etch stopper 114. In the related art array substrate, the active layer is exposed to light. In addition, the active layer in the related art array substrate is over-etched reducing the impurities left on the active layer. Therefore, the active layer is relatively thinner. However, in the present invention, the active layer 124 is not exposed. Thus, the active layer 124 is not required to be a relatively thick.

FIGS. 9A to 9H, 10A to 10H and 11A to 11H are cross-sectional views taken along lines VIIIa-VIIIa, VIIIb-VIIIb and VIIIc-VIIIc of FIG. 7, respectively. FIGS. 9A to 9H, 10A to 10H and 11A to 11H illustrates a first exemplary fabricating process of the exemplary array substrate according to the exemplary embodiment of the present invention. FIGS. 9A to 9H show the switching region, the pixel region and the storage region, FIGS. 10A to 10H show the gate region and FIGS. 11A to 11H show the data region.

Figure 9A:
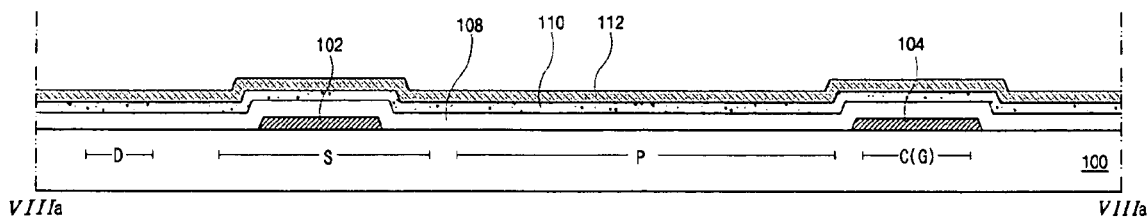
FIGS. 9A to 9H, 10A to 10H and 11A to 11H are cross-sectional views taken along lines VIIIa-VIIIa, VIIIb-VIIIb and VIIIc-VIIIc of FIG. 7, respectively, showing a first exemplary fabrication processes of an array substrate for an LCD device according to the exemplary embodiment of the present invention.
Figure 10A:
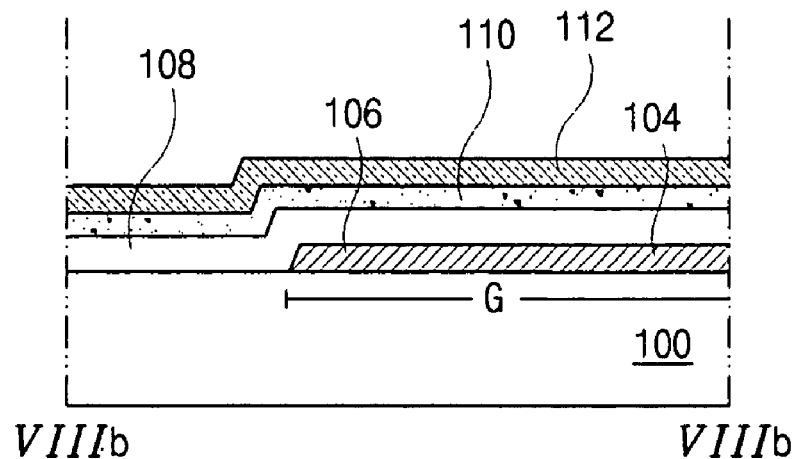
Figure 11A:
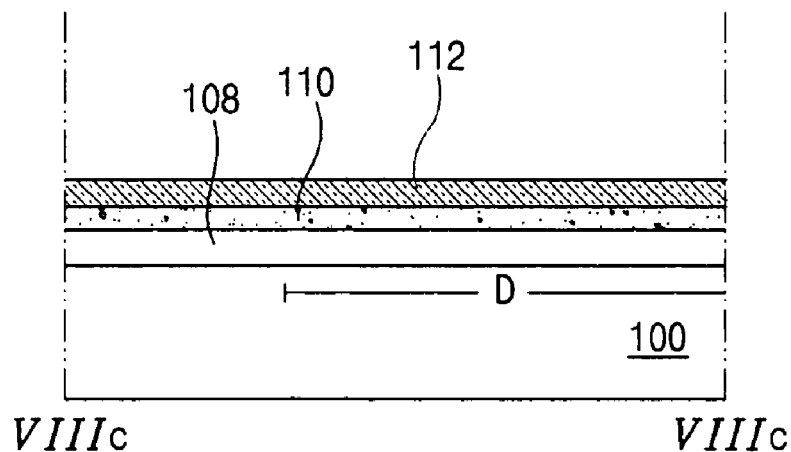

FIGS. 9A, 10A and 11A show a first mask process. A first metal layer (not shown) is disposed on the substrate 100 by depositing respective material/materials selected from a conductive metallic material group including aluminum (Al), aluminum alloy (AlNd), chromium (Cr), molybdenum (Mo), tungsten (W), titanium (Ti), copper (Cu) and tantalum (Ta). Then, the first metal layer is patterned through a first mask process using a first mask (not shown) to form a gate electrode 102, a gate line 104 and a gate pad 106. The gate electrode 102 is formed in the switching region S, and the gate line 104 and the gate pad 106 are formed in the gate region G. The gate pad 106 is disposed at one end of the gate line 104. Next, a first insulating layer 108, an intrinsic amorphous silicon layer 110 and a second insulating layer 112 are sequentially disposed on the gate electrode 102, the gate line 104 and the gate pad 106. The first and second insulating layers 108 and 112 are formed by depositing respective material/materials selected from an inorganic insulating material group including silicon nitride (SiNx) and silicon oxide ($SiO_2$).

Figure 9B:
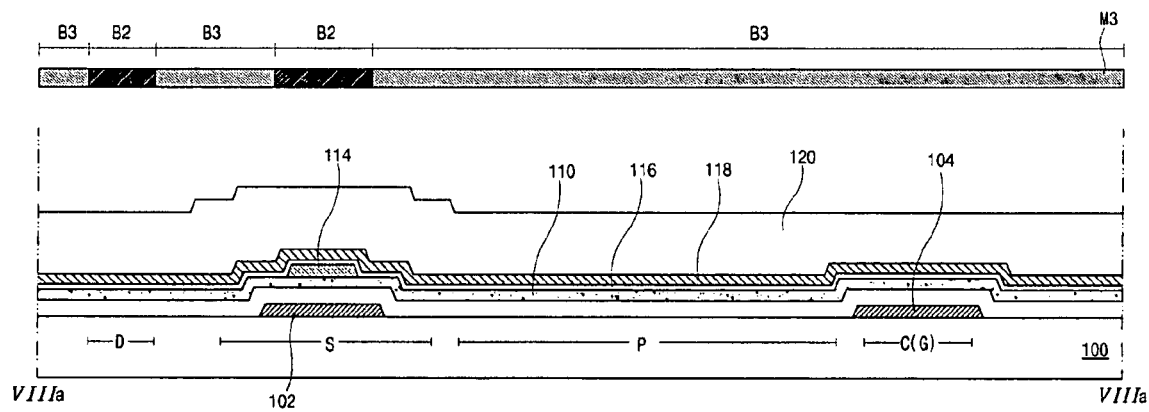
Figure 9C:
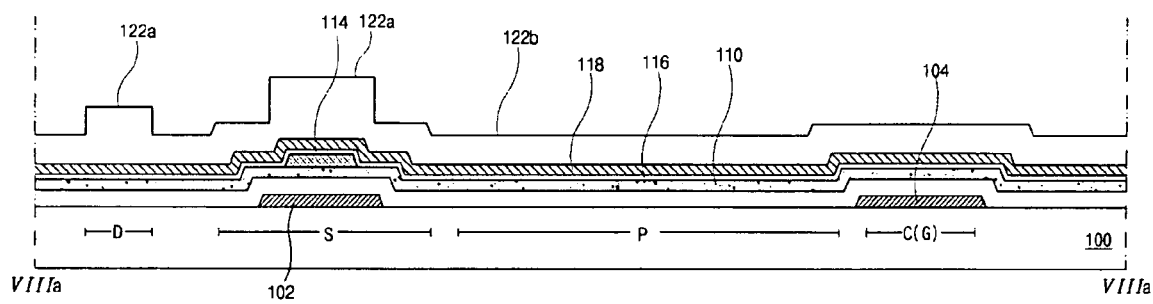
Figure 9D:
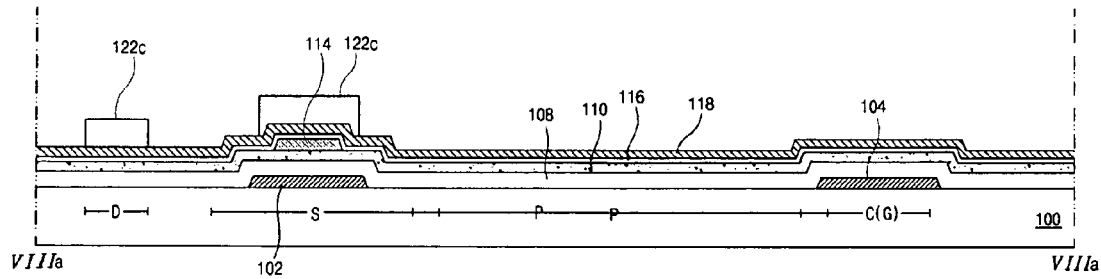
Figure 9E:
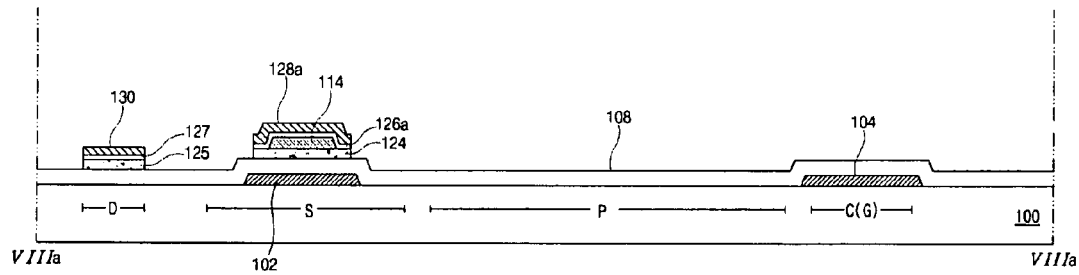
Figure 10B:
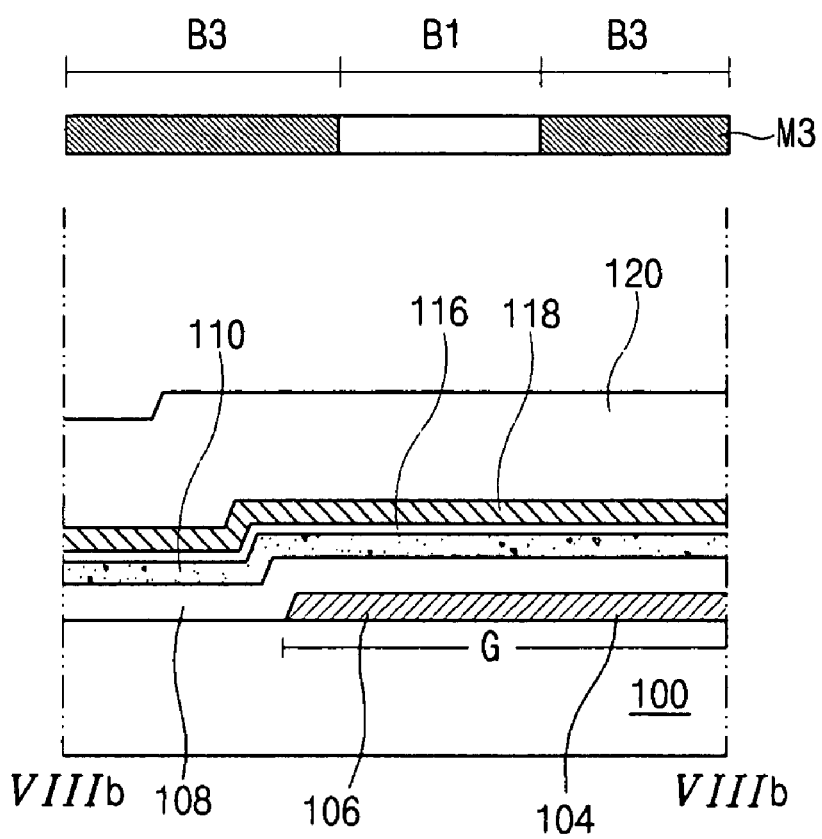
Figure 10C:
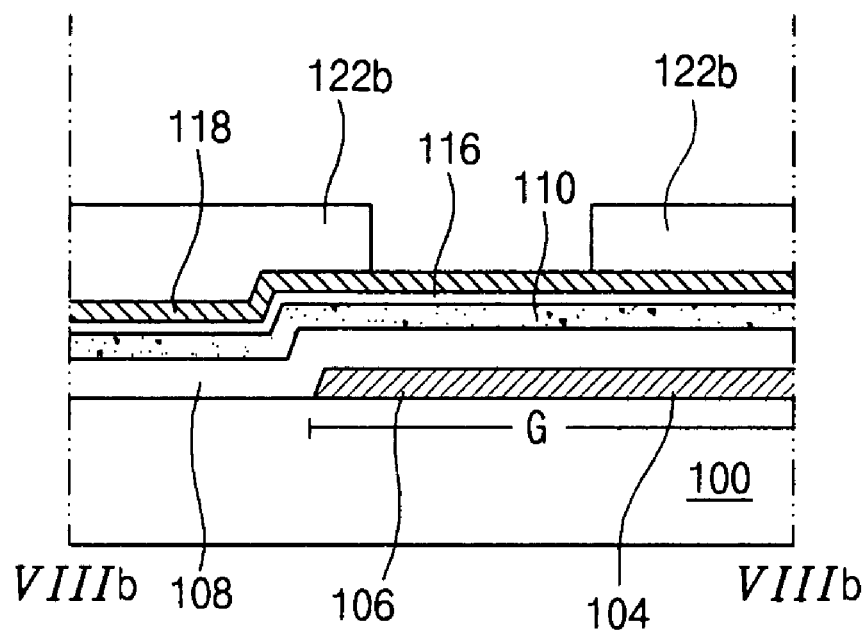
Figure 10D:
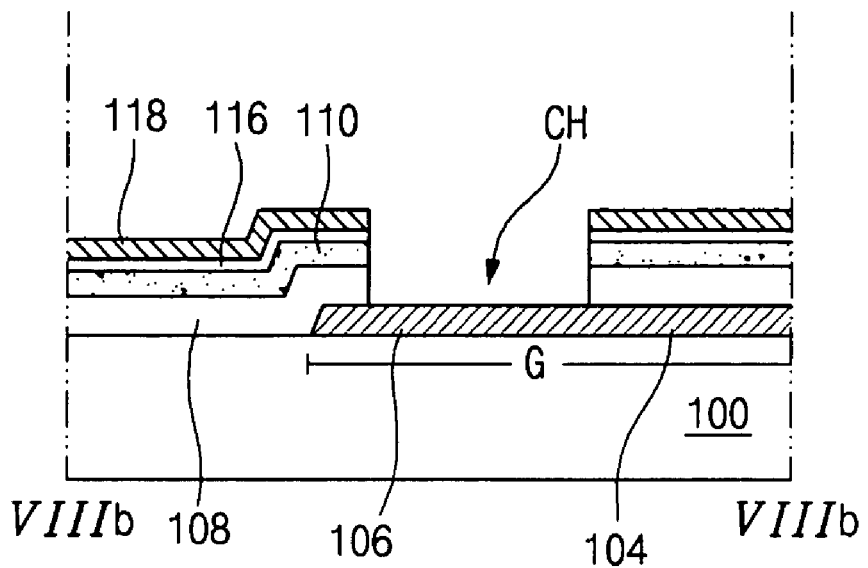
Figure 10E:
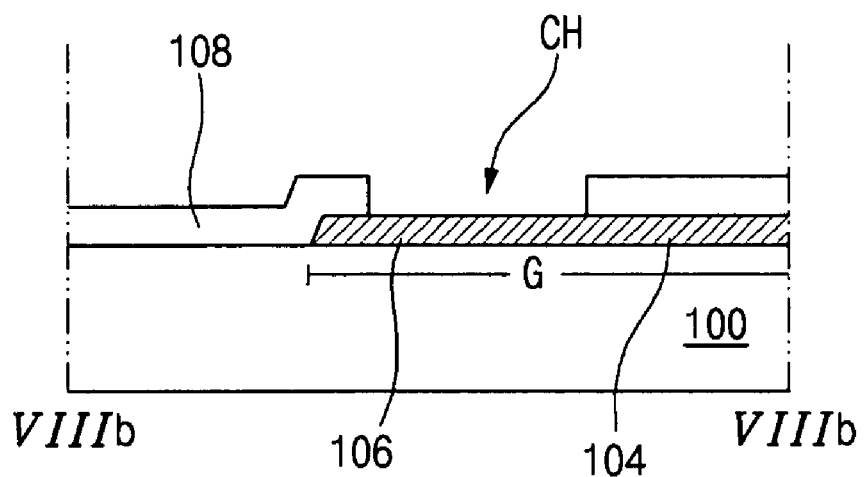
Figure 11B:
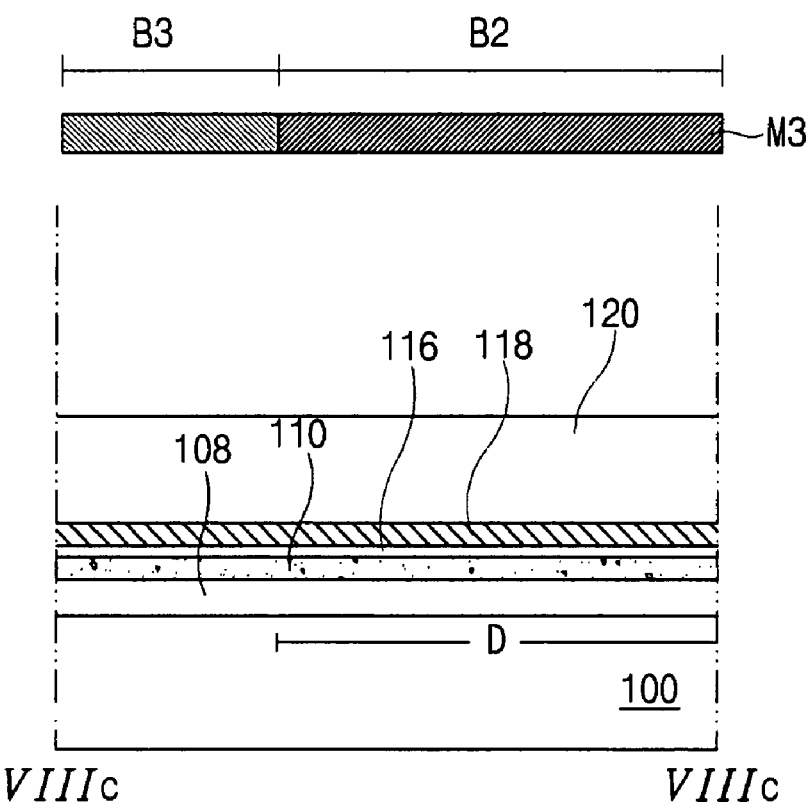

FIGS. 9B to 9E, 10B to 10E and 11B to 11E show second and third mask process. As shown in FIGS. 9B, 10B and 11B, the second insulating layer 112 is patterned through the second mask process using a second mask (not shown) to form an etch stopper 114 in the switching region S. The etch stopper 114 is formed at a portion corresponding to the gate electrode 102 on the intrinsic amorphous silicon layer 110. The second insulating layer 112 is removed in the second mask process except for the switching region S.

Next, the third mask process is performed. An impurity-doped amorphous silicon layer 116, a second metal layer 118 and a first photoresist (PR) layer 120 are sequentially disposed on the substrate 100 including the etch stopper 114. The second metal layer 118 is formed of respective material/materials selected from a conductive metallic material group including aluminum (Al), aluminum alloy (AlNd), chromium (Cr), molybdenum (Mo), tungsten (W), titanium (Ti), copper (Cu) and tantalum (Ta). Then, a third mask M3 having a transmitting portion B1, a blocking portion B2 and a half-transmitting portion B3 is disposed over the first PR layer 120. The transmitting portion B1 has a relatively high light transmittance so that light through the transmitting portion B1 can change the chemical property of the PR layer completely. The blocking portion B2 shields light. The half-transmitting portion B3 has a slit structure or a half-transmitting film lowering the intensity of light transmits through the half-transmitting portion B3.

As a result, the light transmittance at the half-transmitting portion B3 is lower than the transmitting portion B1 and is greater than the blocking portion B2. The transmitting portion B1 of the third mask M3 is positioned corresponding to the gate pad 106, and the blocking portion B2 of the third mask M3 is positioned corresponding to the switching region S and the data region D. The half-transmitting portion B3 of the third mask M3 is positioned corresponding to other regions. As shown in FIG. 9B, a portion of the blocking portion B2 corresponding to the switching region S is greater than the width of the etch stopper 114. The first PR layer 120 is exposed to light through the third mask M3 and the exposed first PR layer 120 is developed.

Figure 11C:
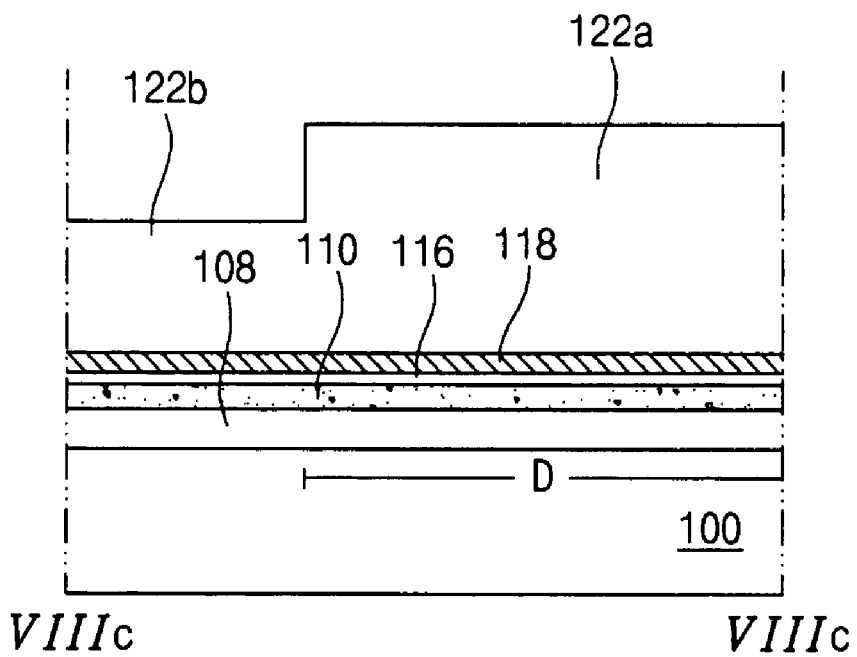

As shown in FIGS. 9C, 10C and 11C, first and second PR patterns 122a and 122b are formed on the second metal layer 118 by developing the first PR layer 120 (of FIGS. 9B, 10B and 11B). The first PR pattern 122a corresponds to the blocking portion B2 of the third mask M3, and the second PR pattern 122b corresponds to the half-transmitting portion B3 of the third mask M3. The first PR pattern 122a has a thickness greater than the second PR pattern 122b and is formed in the switching region S and the data region D. As shown in FIG. 10C, a portion of the first PR layer 120 (of FIG. 10B) corresponding to the transmitting portion B1 is removed exposing the second metal layer 118 over the gate pad 106 through the first and second PR patterns 122a and 122b.

Figure 11D:
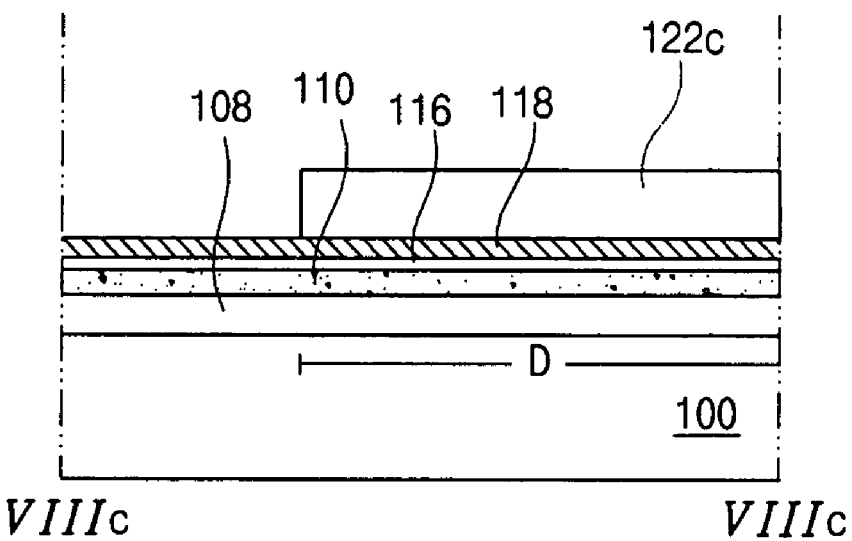

As shown in FIG. 10D, the exposed second metal layer 118 over the gate pad 106, the impurity-doped amorphous silicon layer 116, the intrinsic amorphous silicon layer 110 and the first insulating layer 108 are etched using the first and second PR patterns 122a and 122b as an etching mask to form a gate pad contact hole CH. The gate pad contact hole CH exposes the gate pad 106. Then, as shown in FIGS. 9D and 11D, the first and second PR patterns 122a and 122b are ashed to form a third PR pattern 122c. The first PR pattern 122a is partially removed by ashing to form the third PR pattern 122c and is formed in the switching region S and the data region D. The second PR pattern 122b is completely removed to expose the second metal layer 118.

Figure 11E:
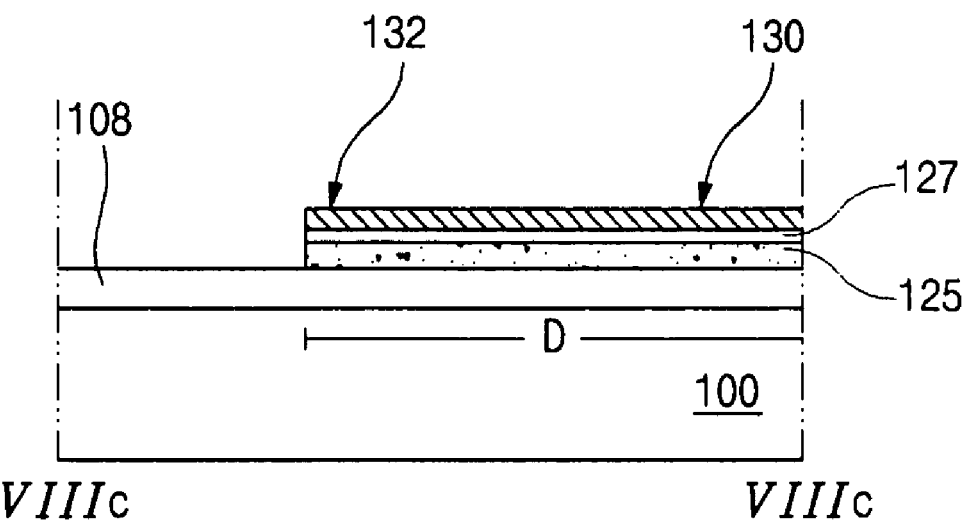

Next, as shown in FIGS. 9E, 10E and 11E, the exposed second metal layer 118, the impurity-doped amorphous silicon layer 116 and the intrinsic amorphous silicon layer 110 (all three layers from FIGS. 9D, 10D and 11D) are etched using the third PR pattern 122c as an etching mask to form an active layer 124, an ohmic contact pattern 126a, a buffer metal pattern 128a, a first data layer 125, a second data layer 127, a third data layer 130 and a data pad 132. As shown in FIG. 9E, the active layer 124 is formed on the gate insulating layer 108 at a portion corresponding to the gate electrode 102. The ohmic contact pattern 126a and the buffer metal pattern 128a are sequentially laminated on the active layer 124. As shown in FIG. 11E, the first to third data layers 125, 127 and 130 and the data pad 132 are formed in the data region D. The data pad 132 is disposed at one end of the data region D. The first and second data layers 125 and 127 are disposed under the data pad 132. Since the first to third data layers 125, 127 and 130 are patterned at the same time, the first and second data layers 125 and 127, particularly the first data layer 127 of intrinsic amorphous silicon, does not protruded beyond the third data layer 130.

Figure 9F:
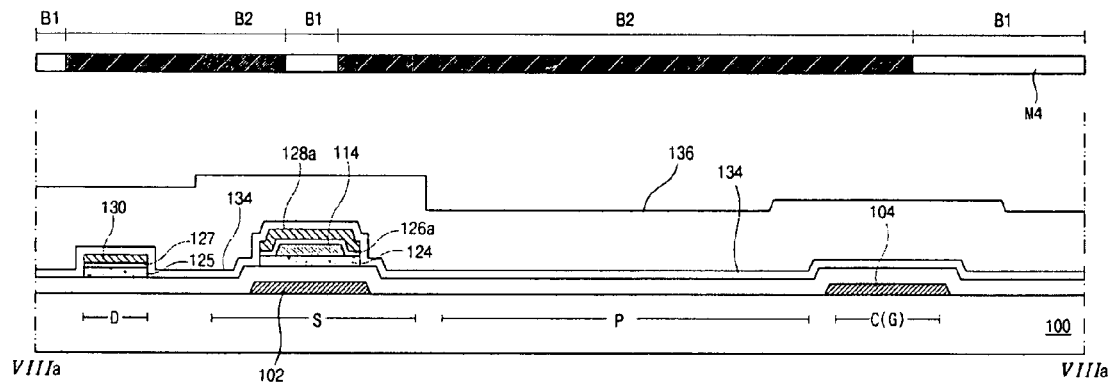
Figure 9G:
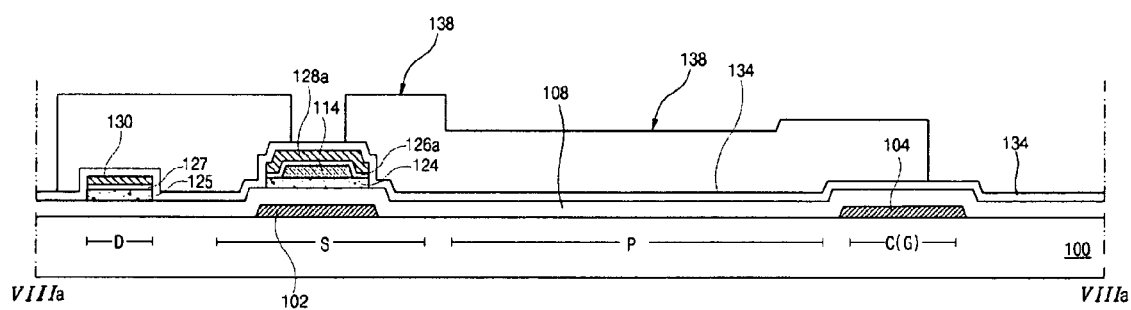
Figure 9H:
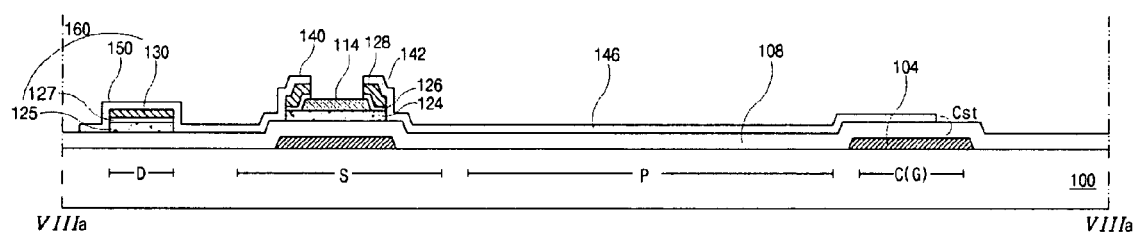
Figure 10F:
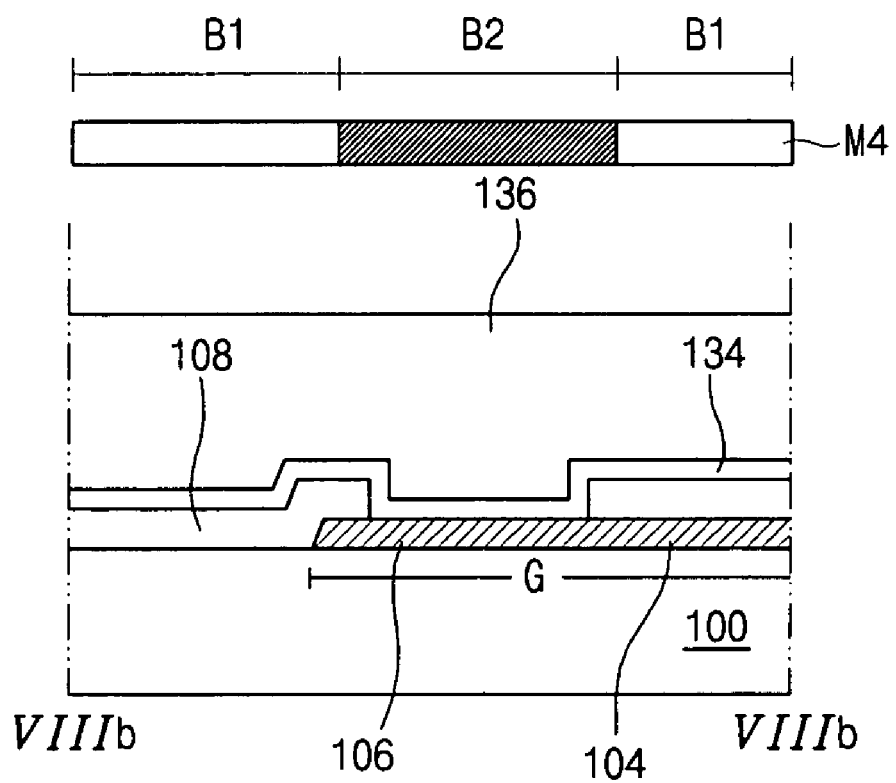
Figure 10G:
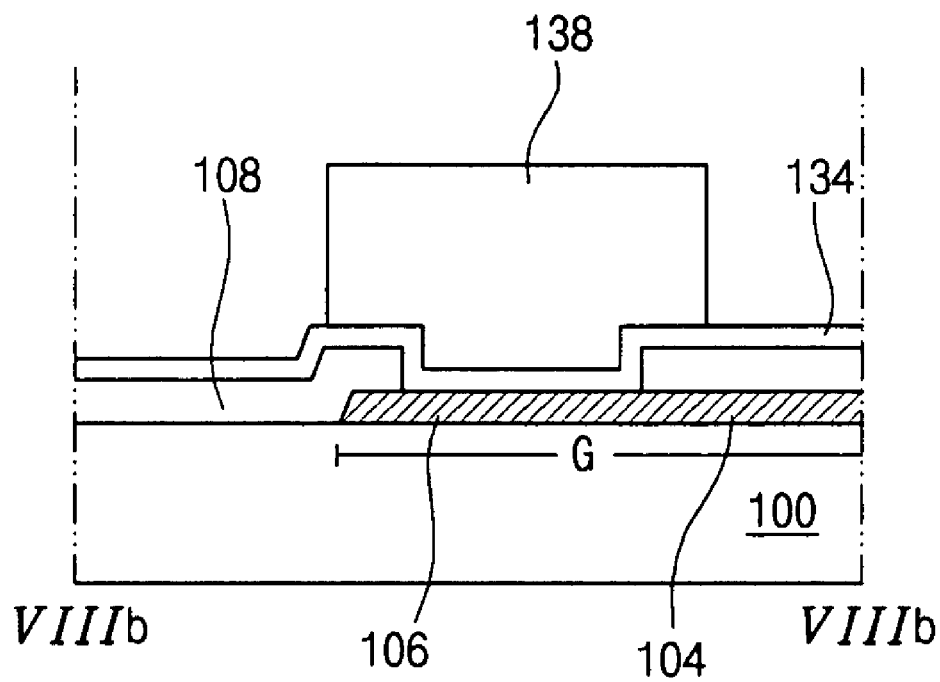
Figure 10H:
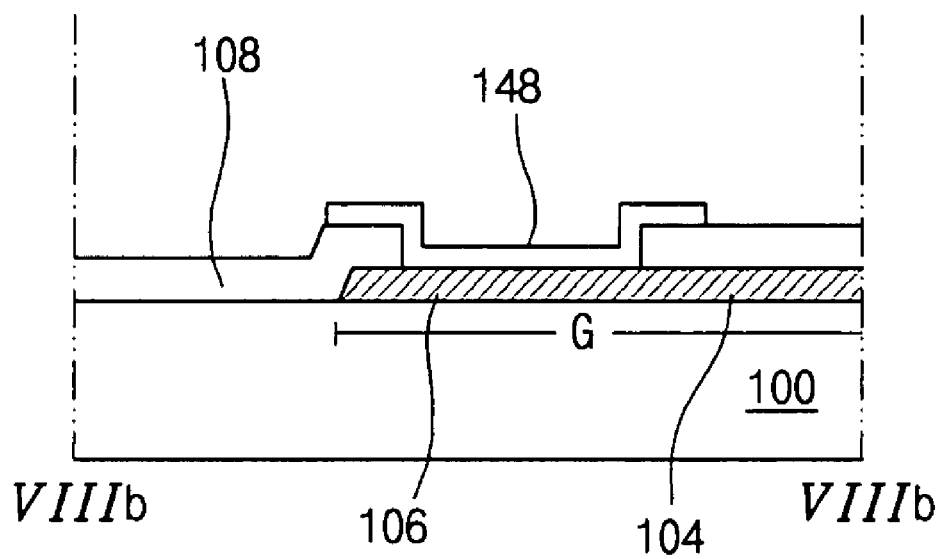
Figure 11F:
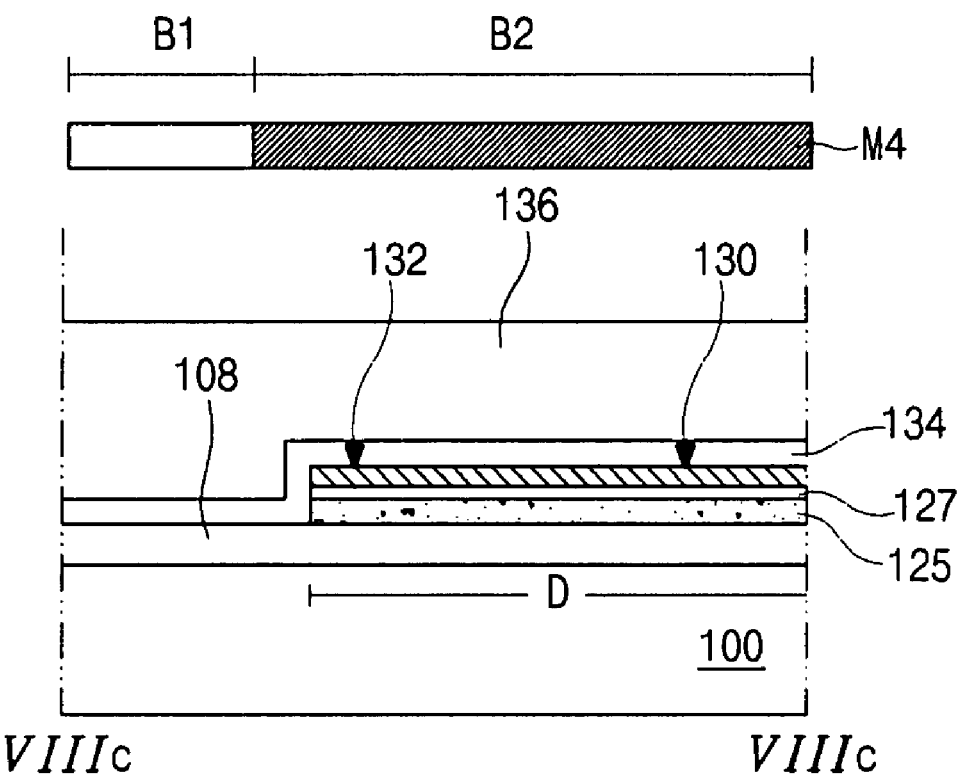

FIGS. 9F to 9H, 10F to 10H and 11F to 11H show a fourth mask process. As shown in FIGS. 9F, 10F and 11F, a transparent conductive material layer 134 is disposed on the buffer metal pattern 128a and the third data layer 130 by depositing a respective material selected from a transparent conductive material group including indium-tin-oxide (ITO) and indium-zinc-oxide (IZO). A second PR layer 136 is formed on the transparent conductive material layer 134, and a fourth mask M4 having a transmitting portion B1 and a blocking portion B2 is disposed over the second PR layer 136. The blocking portion B2 of the fourth mask M4 corresponds to a majority portion of the pixel region P, a portion of the data region D, a portion of the storage region C and the gate pad 106. The transmitting portion B1 of the fourth mask M4 corresponds to a center portion of the gate electrode 102. The second PR layer 136 is exposed to light through the fourth mask M4.

Figure 11G:
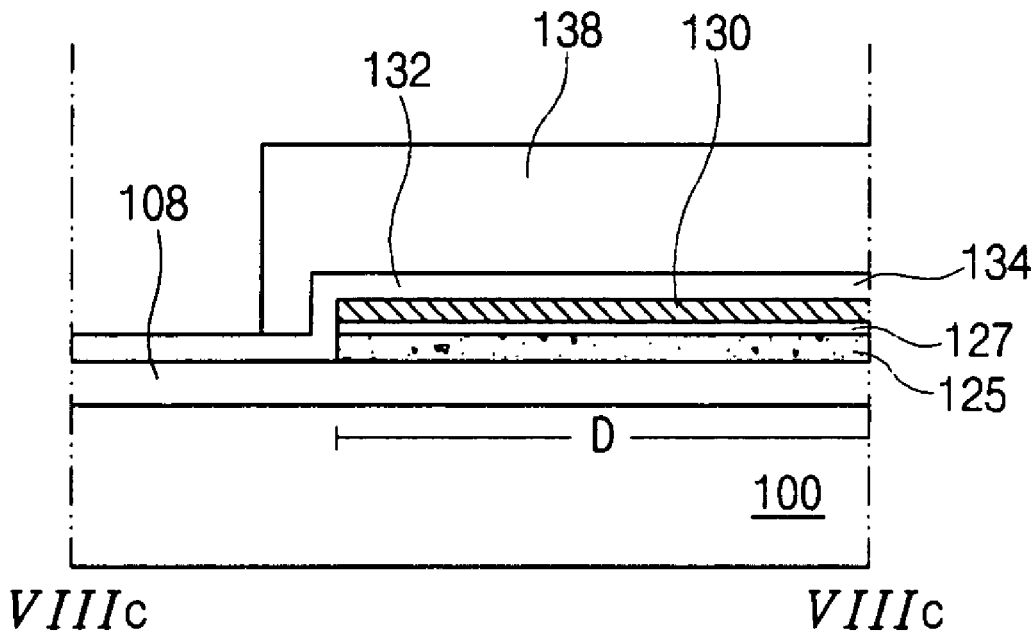

As a result, as shown in FIGS. 9G, 10G and 11G, a fourth PR pattern 138 is formed on the transparent conductive material layer 134 such that the transparent conductive material layer 134 corresponding to the transmitting portion B1 of the fourth mask M4 is exposed. As seen from the FIGS. 9G, 10G and 11G, the fourth PR pattern 138 corresponds to two sides of the gate electrode 102, the pixel region P, the data region D and the gate pad 106. The fourth PR pattern 138 partially overlaps the storage region C.

Figure 11H:
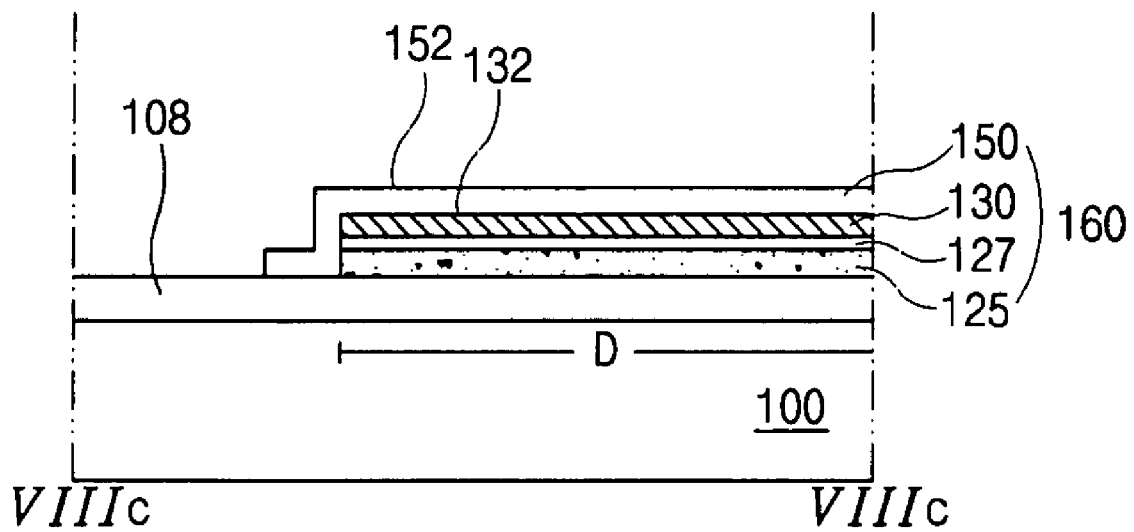

Next, as shown in FIG. 9H, 10H, 11H, the transparent conductive material layer 134 is etched using the fourth PR pattern 138 as an etching mask to form a source electrode 140, a drain electrode 142, a pixel electrode 146, a gate pad terminal 148, a fourth data layer 150 and a data pad terminal 152. The source and drain electrodes 140 and 142 are formed in the switching region S and spaced apart from each other to expose the buffer metal pattern 128a. The pixel electrode 146 extends from the drain electrode 142 and is disposed in the pixel region P. The pixel electrode 146 overlaps the gate line 104 in the storage region C to form a storage capacitor Cst. A portion of the gate line 104 overlapping the pixel electrode 146 functions as a first storage electrode, a portion of the pixel electrode 146 overlapping the gate line 104 functions as a second storage electrode, and the first insulating layer 108 between the first and second storage electrodes functions as a dielectric material layer. The overlapped portion of the gate line 104, the overlapped portion of the pixel electrode 146 and the first insulating layer 108 form the storage capacitor Cst. The fourth data layer 150 extends from the source electrode 140. The fourth data layer 150 covers both an upper surface of the third data layer 130 and side surfaces of the first to third data layers 125, 127 and 130.

As discussed earlier, the first to fourth data layers 125, 127, 130 and 150 form a data line 160. And, as shown in FIG. 10H, the gate pad terminal 148 is formed on the gate pad 106 and contacts the gate pad 106 within the gate pad contact hole CH (of FIG. 10E). As shown in FIG. 11H, the data pad terminal 152 extends from the fourth data layer 150 to contact the data pad 132. The data pad terminal 152 covers both an upper surface of the data pad 132 and side surfaces of the data pad 132. The source electrode 140, the drain electrode 142, the pixel electrode 146, the gate pad terminal 148, the fourth data layer 150 and the data pad terminal 152 are all formed of the transparent conductive material.

As shown in FIGS. 9G and 9H, the buffer metal pattern 128a exposed between the source and drain electrodes 140 and 142 and the ohmic contact pattern 126a under the buffer metal pattern 128a are etched using the source and drain electrodes 140 and 142 as an etching mask to form a buffer metal layer 128 and a ohmic contact layer 126. However, the active layer 124 is not exposed because of a presence of the etch stopper 114. When a dry etching method is available to the buffer metal pattern 128a (of FIG. 9G), the buffer metal pattern 128a (of FIG. 9G) and the ohmic contact pattern 126a (of FIG. 9G) are etched simultaneously. The buffer metal pattern 128a may include molybdenum (Mo). However, when the dry etching method is not available, the ohmic contact pattern 126a is dry-etched after the buffer metal pattern 128a is wet-etched. Since the active layer 124 is not exposed, there is no damage to the active layer 124 while forming the ohmic contact layer 126.

Through the above exemplary four mask process, the exemplary array substrate according to the first exemplary embodiment is fabricated. In summary, the first mask process includes a step of forming the gate electrode, the gate line and the gate pad, the second mask process includes a step of forming the etch stopper, the third mask process includes a step of forming the active layer, the first to third data layer, the data pad, and the fourth mask process includes a step of forming the data line, the source and drain electrodes, the buffer metal layer, the ohmic contact layer, the pixel electrode, the gate pad terminal and the data pad terminal.

FIGS. 12A to 12K, 13A to 13K and 14A to 14K are cross-sectional views taken along lines VIIIa-VIIIa, VIIIb-VIIIb and VIIIc-VIIIc of FIG. 7, respectively, showing a second exemplary fabrication process of the exemplary array substrate according to the exemplary embodiment of the present invention. FIGS. 12A to 12K show the switching region S the pixel region P and the storage region C, FIGS. 13A to 13K show the gate region G and FIGS. 14A to 14K show the data region D.

Figure 12A:
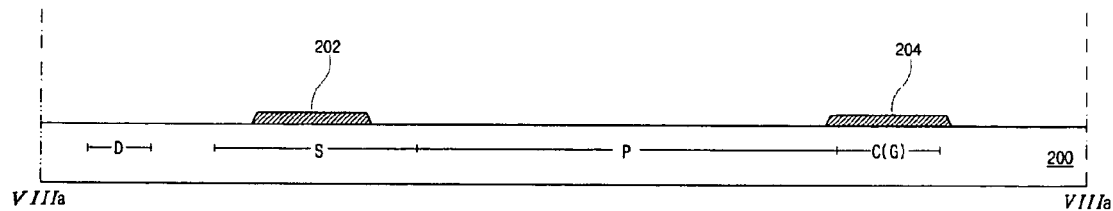
Figure 12B:
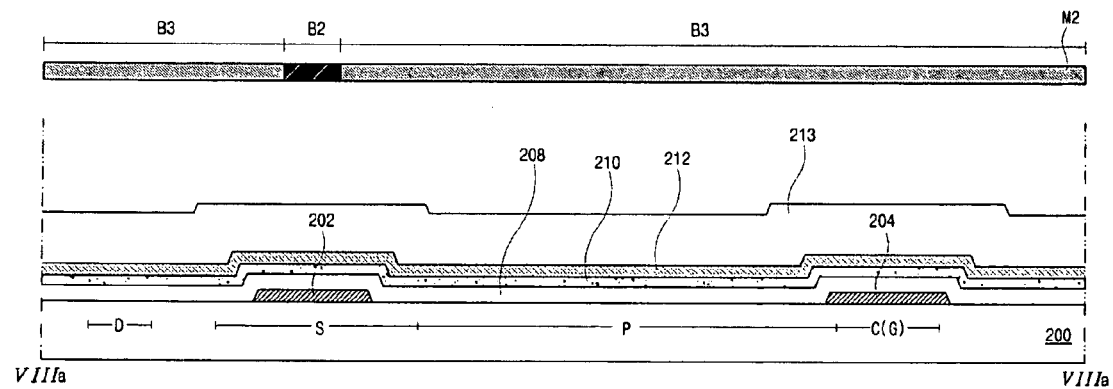
Figure 13A:
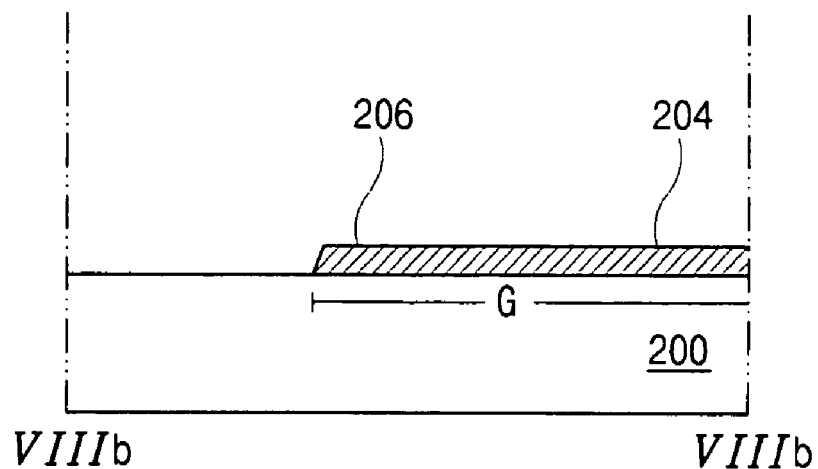
Figure 13B:
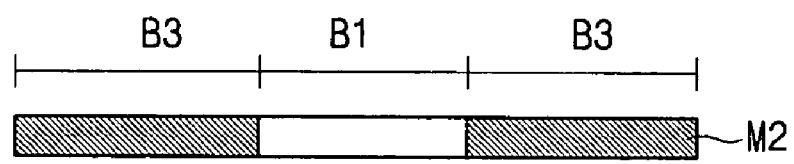
Figure 13B:
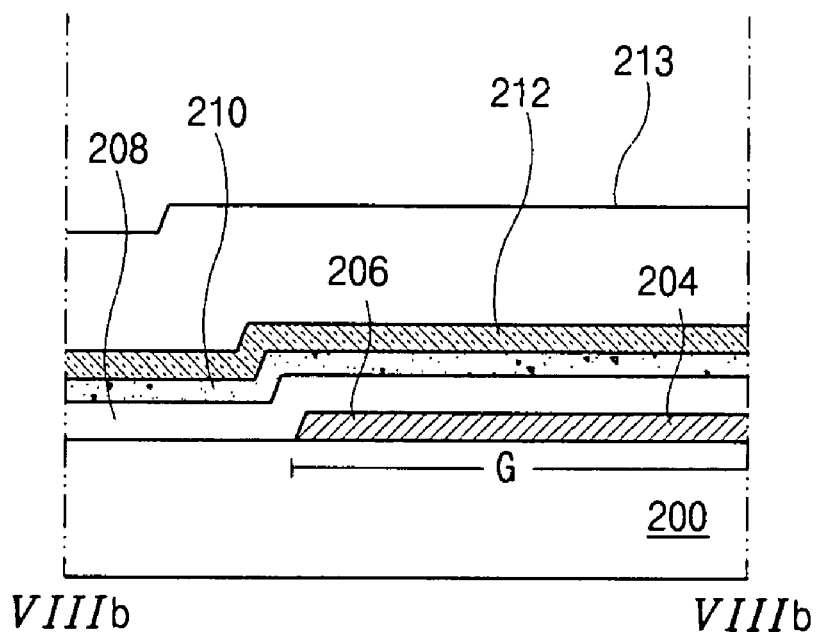
Figure 14A:
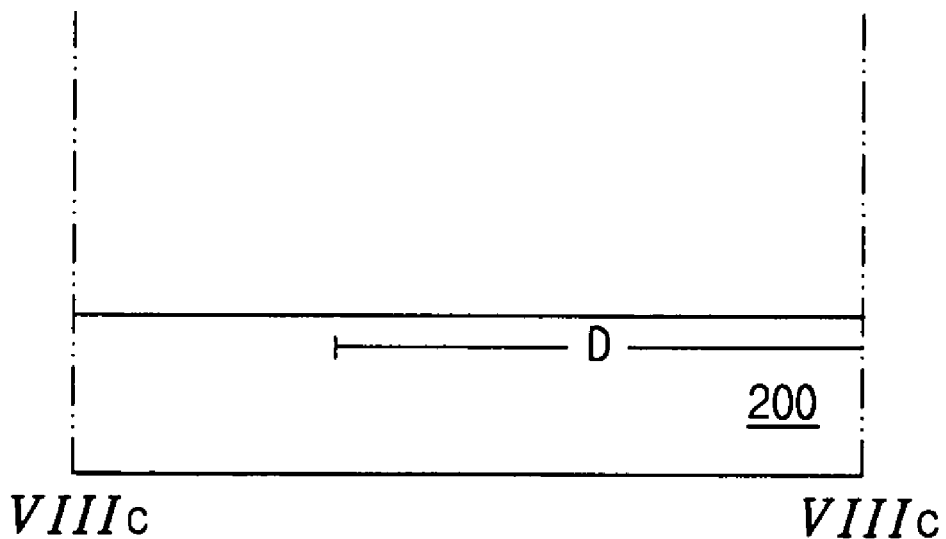
Figure 14B:
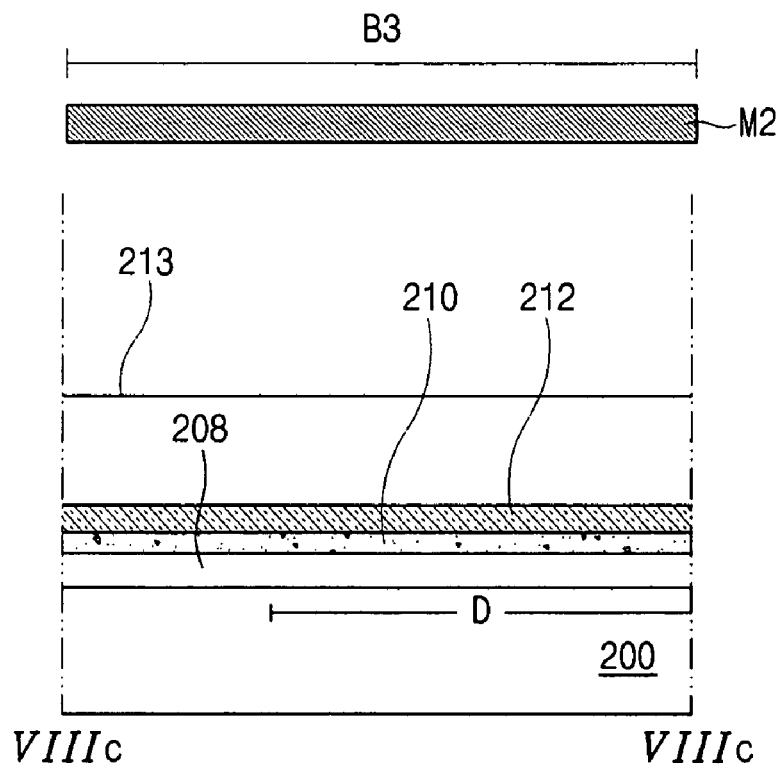

FIGS. 12A, 13A and 14A show a first mask process. A first metal layer (not shown) is formed on a substrate 200 by depositing respective material/materials selected from a conductive metallic material group including aluminum (Al), aluminum alloy (AlNd), chromium (Cr), molybdenum (Mo), tungsten (W), titanium (Ti), copper (Cu) and tantalum (Ta). Then, the first metal layer is patterned using a first mask (not shown) to form a gate electrode 202, a gate line 204 and a gate pad 206. The gate electrode 202 is formed in the switching region S, and the gate line 204 and the gate pad 206 are formed in the gate region G. The gate pad 206 is disposed at one end of the gate line 204.

FIGS. 12B to 12E, 13B to 13E and 14B to 14E show a second mask process. A first insulating layer 208, an intrinsic amorphous silicon layer 210 and a second insulating layer 212 are sequentially disposed on the gate electrode 202, the gate line 204 and the gate pad 206. The first and second insulating layers 208 and 212 are formed by depositing respective material/materials selected from an inorganic insulating material group including silicon nitride (SiNx) and silicon oxide ($SiO_2$). A first PR layer 213 is formed on the second insulating layer 212, and a second mask M2 including a transmitting portion B1, a blocking portion B2 and a half-transmitting portion B3 is disposed over the first PR layer 213. The transmitting portion B1 has a relatively higher light transmittance, thereby changing the chemical property of the first PR layer 213 at the transmitting portion B1 completely. The blocking portion B2 shields light. The half-transmitting portion B3 has a slit structure or a half-transmitting film lowering the intensity of light transmitting through the half-transmitting portion B3. Accordingly, light transmittance of the half-transmitting portion B3 is lower than the transmitting portion B1 and is greater than the blocking portion B2. The transmitting portion B1 of the second mask M2 corresponds to the gate pad 206, and the blocking portion B2 of the second mask M2 corresponds to a center portion of the gate electrode 202. The half-transmitting portion B3 of the second mask M2 corresponds to other portions. The first PR layer 213 is exposed to light through the second mask M2.

Figure 12C:
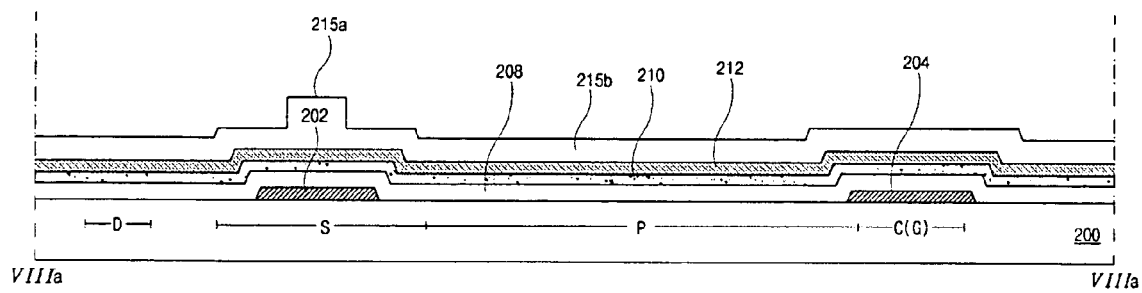
Figure 13C:
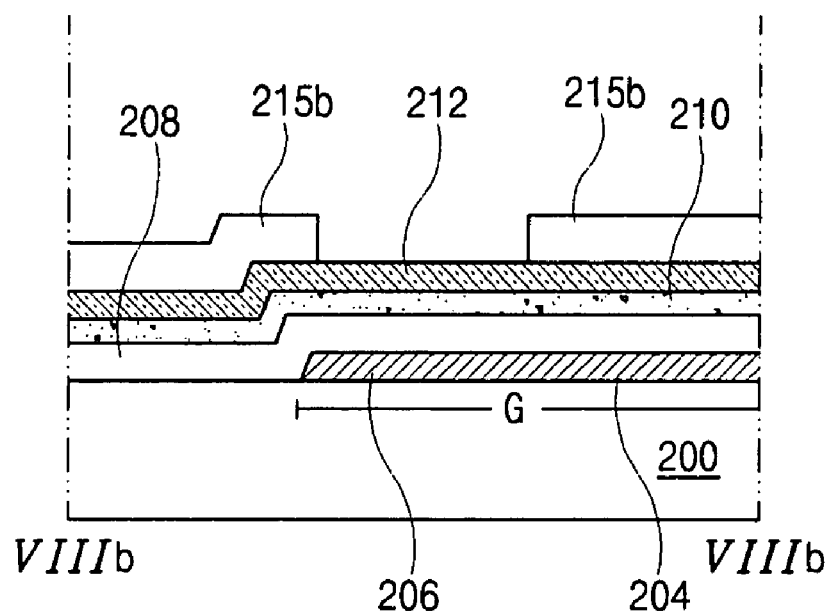
Figure 14C:
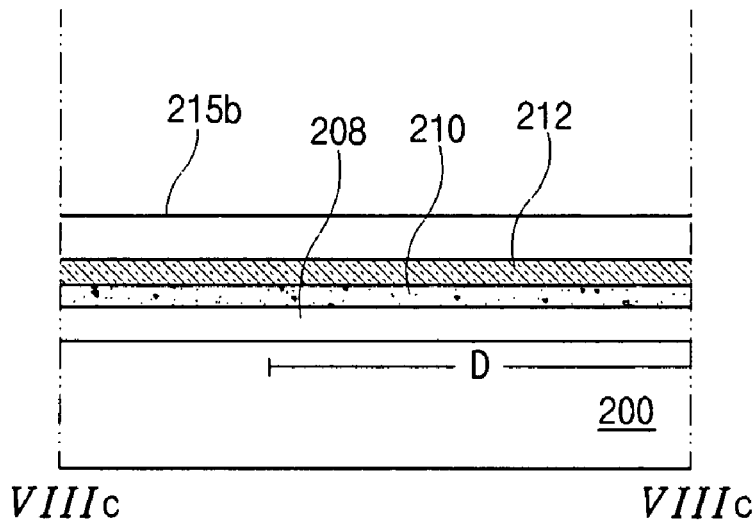

As shown in FIGS. 12C, 13C and 14C, the first PR layer 213 is developed to form first and second PR patterns 215a and 215b on the second insulating layer 212. The first PR pattern 215a has a thickness greater than the second PR pattern 215b. The first PR pattern 215a corresponds to the blocking portion B2 of the second mask M2, and the second PR pattern 215b corresponds to the half-transmitting portion B3 of the second mask M2. The first PR pattern 215a is formed corresponds to the center portion of the gate electrode 202 in the switching region S. The first PR layer 213 corresponding to the transmitting portion B1 of the second mask M2 is removed exposing the second insulating layer 212 over the gate pad 206 through the second PR pattern 215b.

Figure 12D:
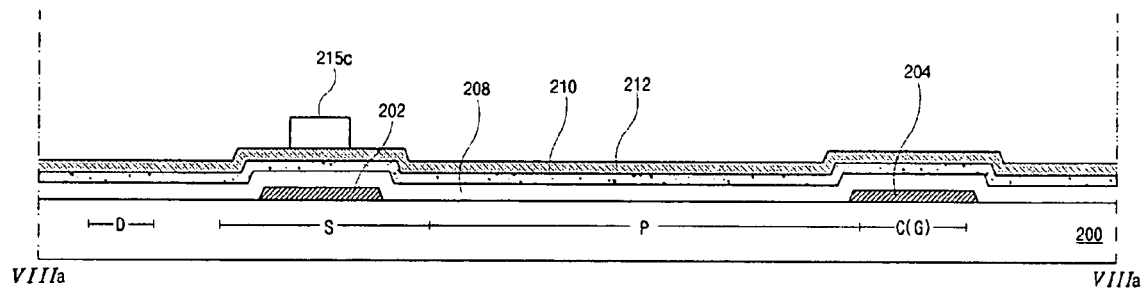
Figure 13D:
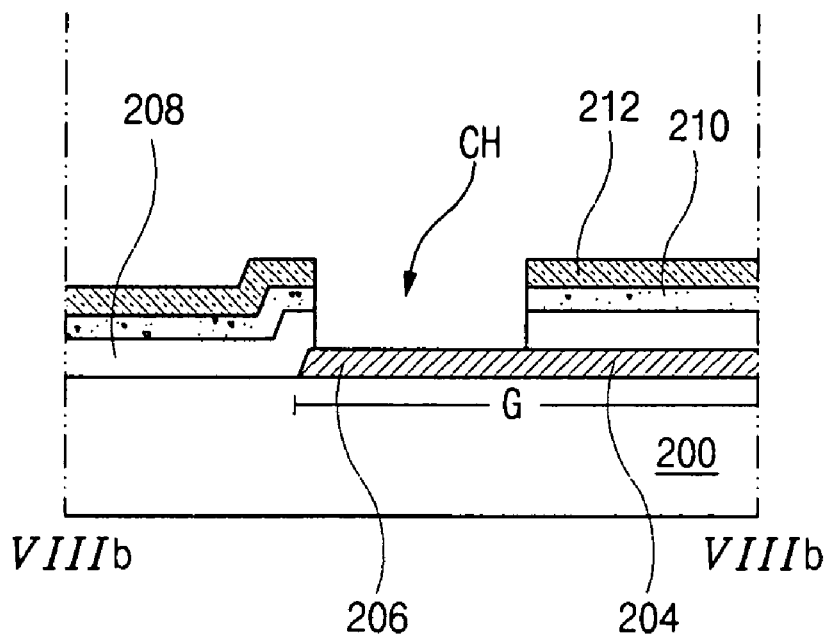
Figure 14D:
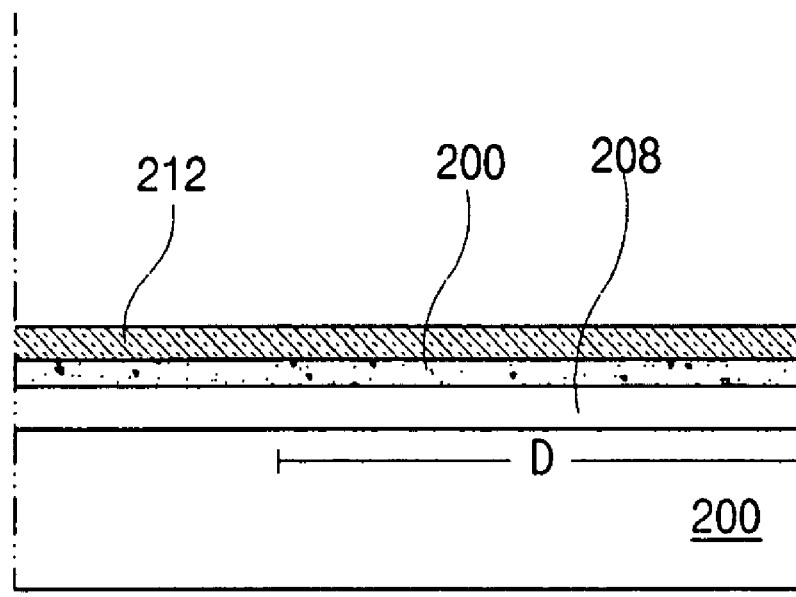

As shown in FIGS. 12D, 13D and 14D, the second insulating layer 212 exposed through the second PR pattern 215b, the intrinsic amorphous silicon layer 210 and the first insulating layer 208 are etched using the first and second PR patterns 215a and 215b as an etching mask to form a gate pad contact hole CH. The gate pad contact hole CH exposes the gate pad 206. Then, the first and second PR patterns 215a and 215b are ashed to form a third PR pattern 215c at the center of the gate electrode 202. The second PR pattern 215b is removed exposing the second insulating layer 212 and the first PR pattern 215a is partially removed to form the third PR pattern 215c having a thickness less than the first PR pattern 215a.

Figure 12E:
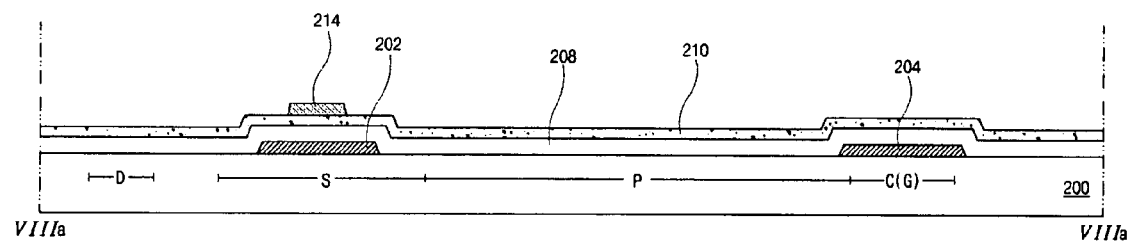
Figure 13E:
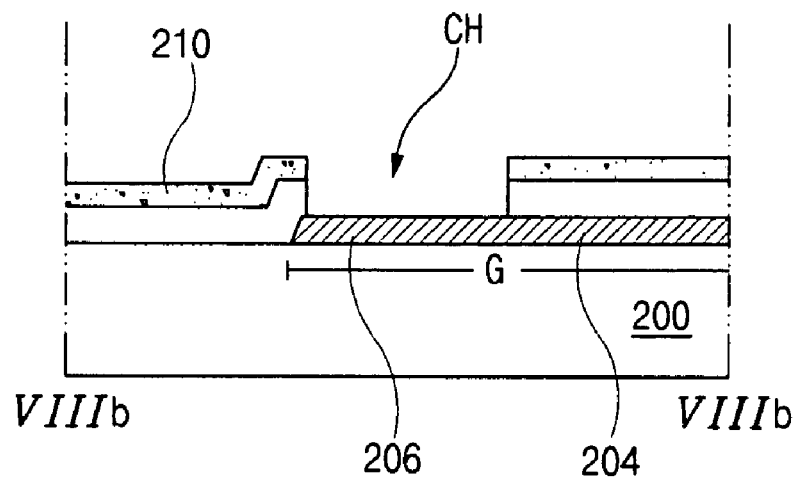
Figure 14E:
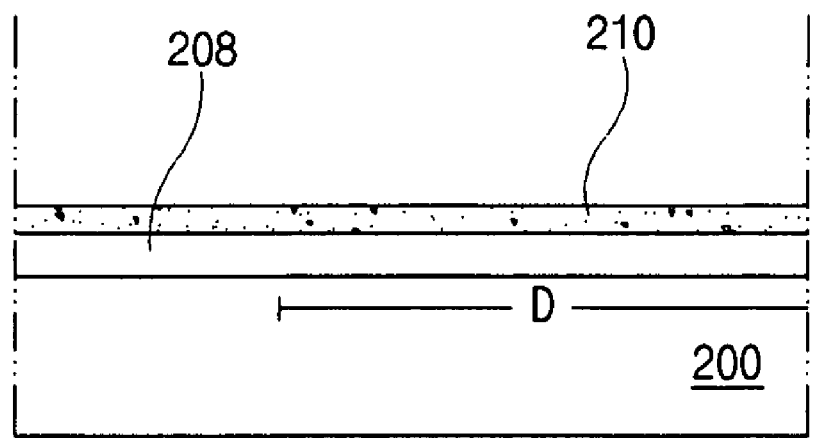

As shown in FIGS. 12E, 13E and 14E, the second insulating layer 212 is etched using the third PR pattern 215c as an etching mask to form an etch stopper 214 over the gate electrode 202. At this time, the intrinsic amorphous silicon layer 210 and the first insulating layer 208 are not etched.

Figure 12F:
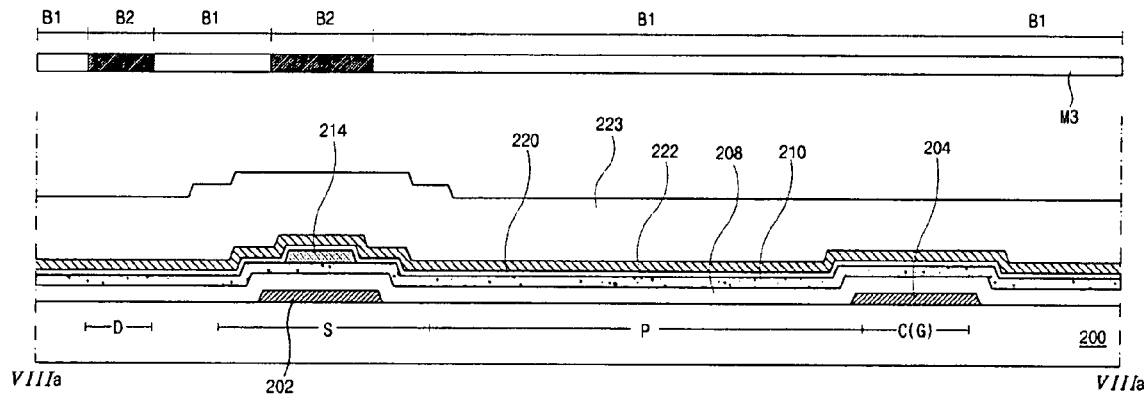
Figure 12G:
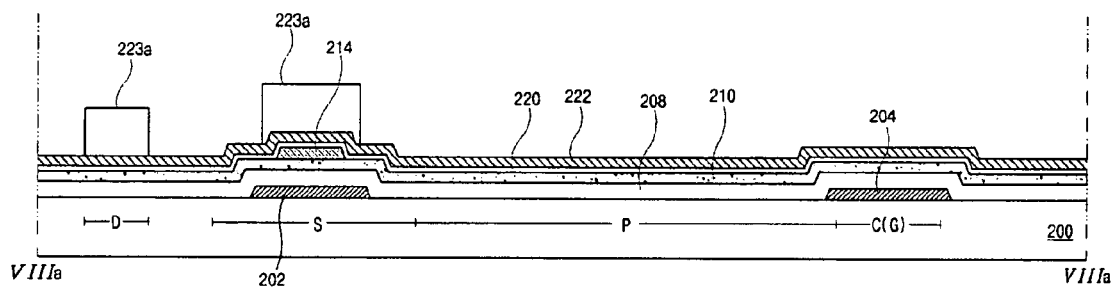
Figure 12H:
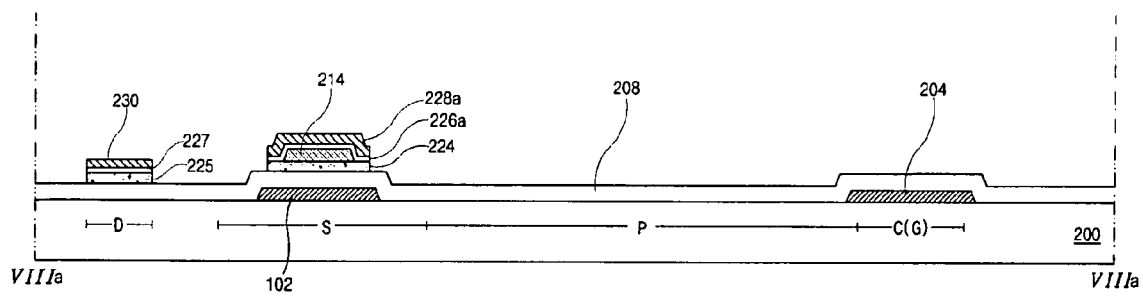
Figure 13F:
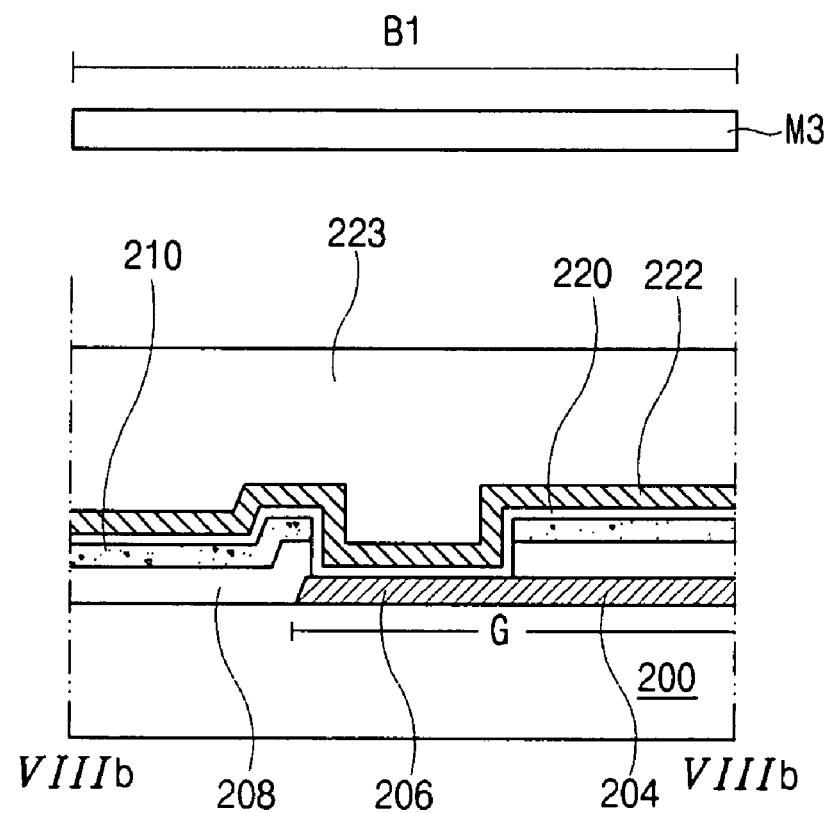
Figure 13G:
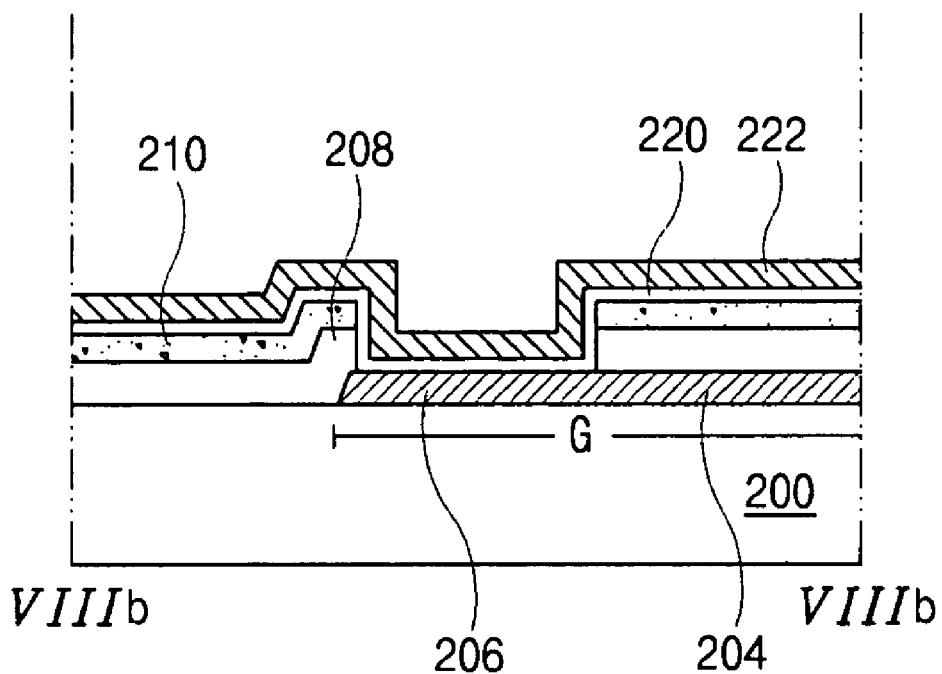
Figure 13H:
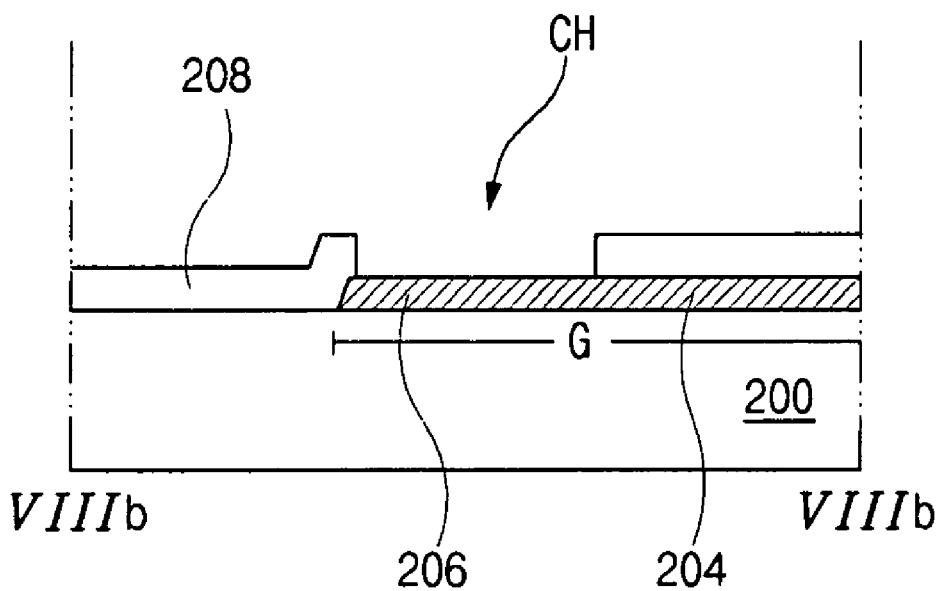
Figure 14F:
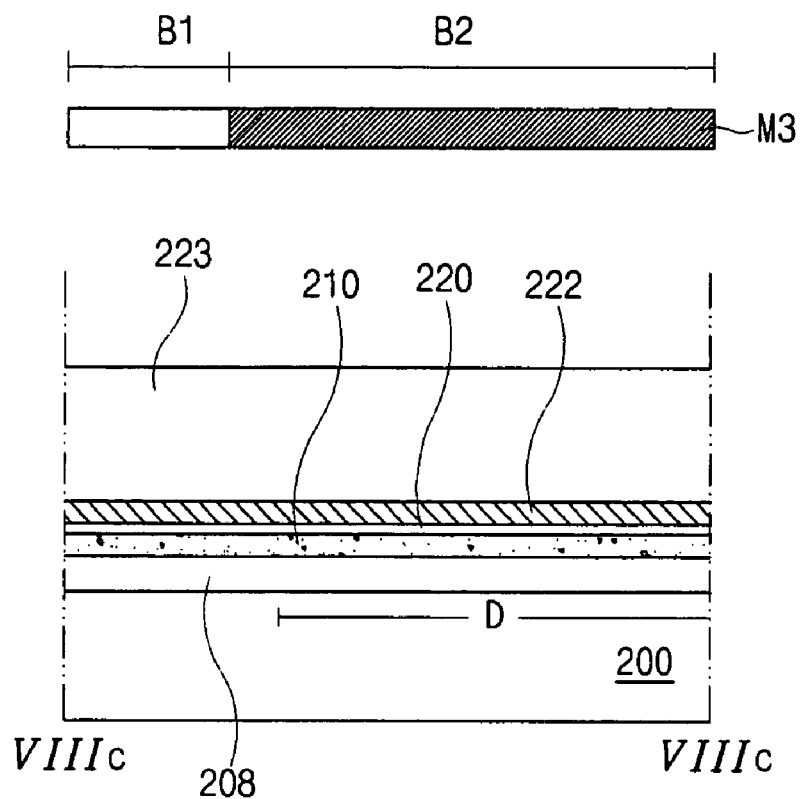

FIGS. 12F to 12H, 13F to 13H and 14F to 14H show a third mask process. As shown in FIGS. 12F, 13F and 14F, an impurity-doped amorphous silicon layer 220, a second metal layer 222 and a second PR layer 223 are sequentially disposed on the etch stopper 214. Thereafter, a third mask M3 having a transmitting portion B1 and a blocking portion B2 is disposed over the second PR layer 223. As mentioned earlier, the transmitting portion B1 has a relatively higher light transmittance and the blocking portion B2 shields light completely. The blocking portion B2 of the third mask M3 corresponds to the gate electrode 202 and the data region D. Then, the second PR layer 223 is exposed to light through the third mask M3.

Figure 14G:
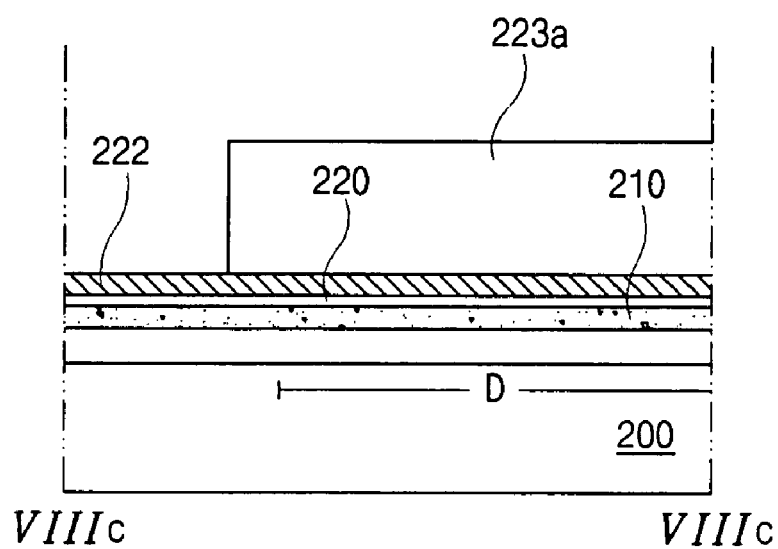

As shown in FIGS. 12G, 13G and 14G, the second PR layer 223 is exposed to light and forming a fourth PR pattern 223a. The portion of the second PR layer 223 under the transmitting portion B1 is removed exposing the second metal layer 222. The fourth PR pattern 223a corresponds to the blocking portion B2 (the gate electrode 202 and the data region D) of the third mask M3. Since the blocking portion B2 of the third mask M3 over the gate electrode 202 has a width less than the gate electrode 202, the fourth PR pattern 223a over the gate electrode 202 has a width less than the gate electrode 202.

Figure 14H:
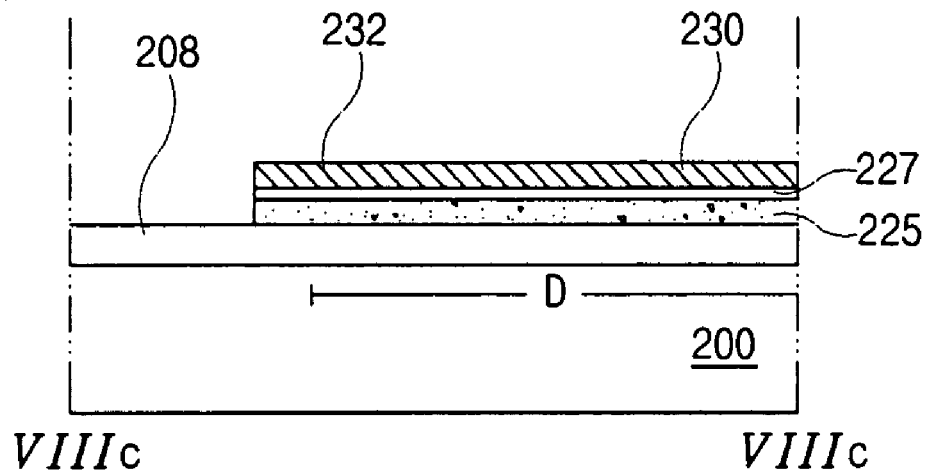

As shown in FIGS. 12H, 13H and 14H, the second metal layer 222 exposed through the fourth PR pattern 223a, the intrinsic amorphous silicon layer 220 and the intrinsic amorphous silicon layer 210 are etched using the fourth PR pattern 223a as an etching mask to form an active layer 224, an ohmic contact pattern 226a, a buffer metal pattern 228a, first to third data layers 225, 227 and 230 and a data pad 232. The active layer 224, the ohmic contact pattern 226a and the buffer metal pattern 228a are formed in the switching region S, and the first to third data layers 225, 227 and 230 and the data pad 232 are formed in the data region D. The active layer 224 is formed on the first insulating layer 208. Since the fourth PR pattern 223a in the switching region S has the width less than the gate electrode 202, the active layer 224 has a width less than the gate electrode 202. In other word, the active layer 224 is formed within the width of the gate electrode 202.

As shown in FIG. 12H, the etch stopper 214 is disposed on the active layer 224. The ohmic contact pattern 226a is formed on the etch stopper 214. The buffer metal pattern 228a is formed on the ohmic contact pattern 226a. As shown in FIG. 14H, the first to third data layers 225, 227 and 230 are formed from the intrinsic amorphous silicon layer 210, the impurity-doped amorphous silicon layer 220 and the second metal layer 222, respectively. The data pad 232 is formed from the second metal layer 222 and disposed at one end of the third data layer 230. Since the first to third data layers 225, 227 and 230 are patterned using a single mask, the first data layer 225 of intrinsic amorphous silicon layer does not protrude beyond the third data layer 230. At the same time, as shown in FIG. 13H, the gate pad 206 is exposed through the gate pad contact hole CH formed by removing the second metal layer 222, the impurity-doped amorphous silicon layer 220 and the intrinsic amorphous silicon layer 210.

Figure 12I:
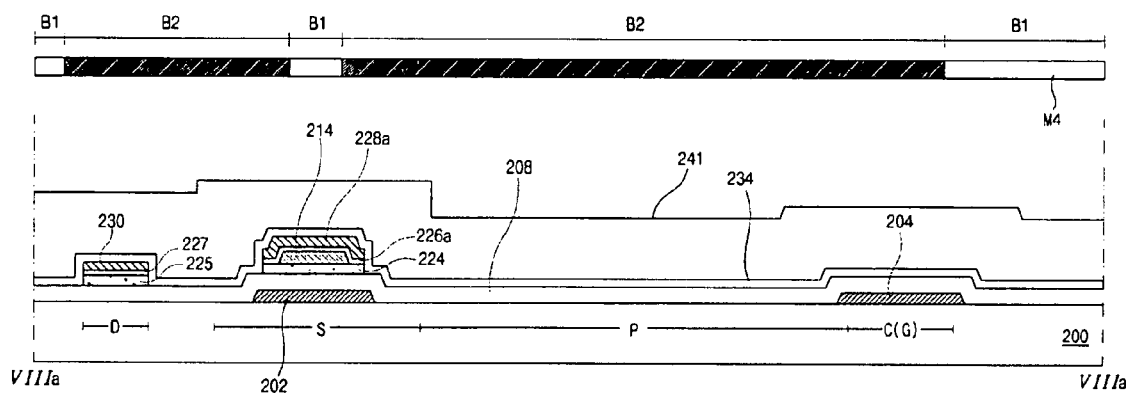
Figure 12J:
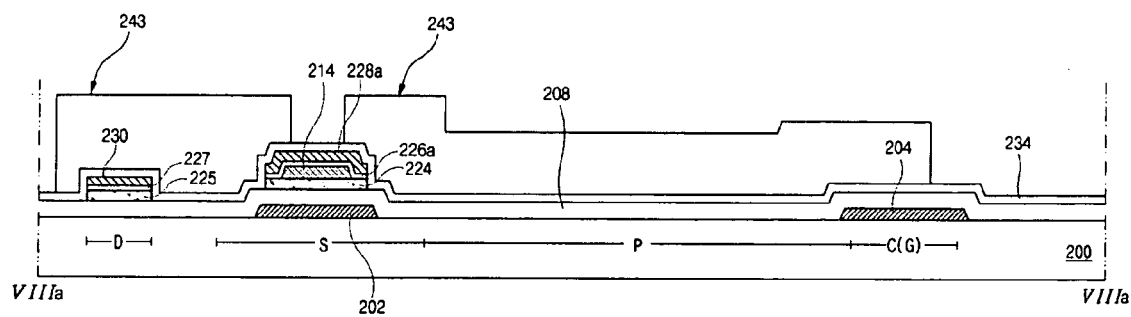
Figure 12K:
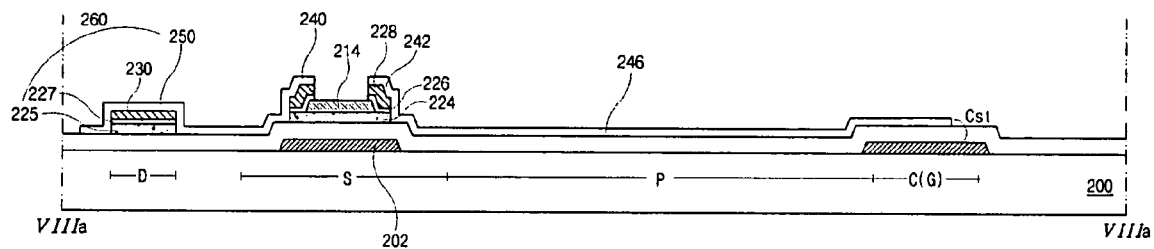
Figure 13I:
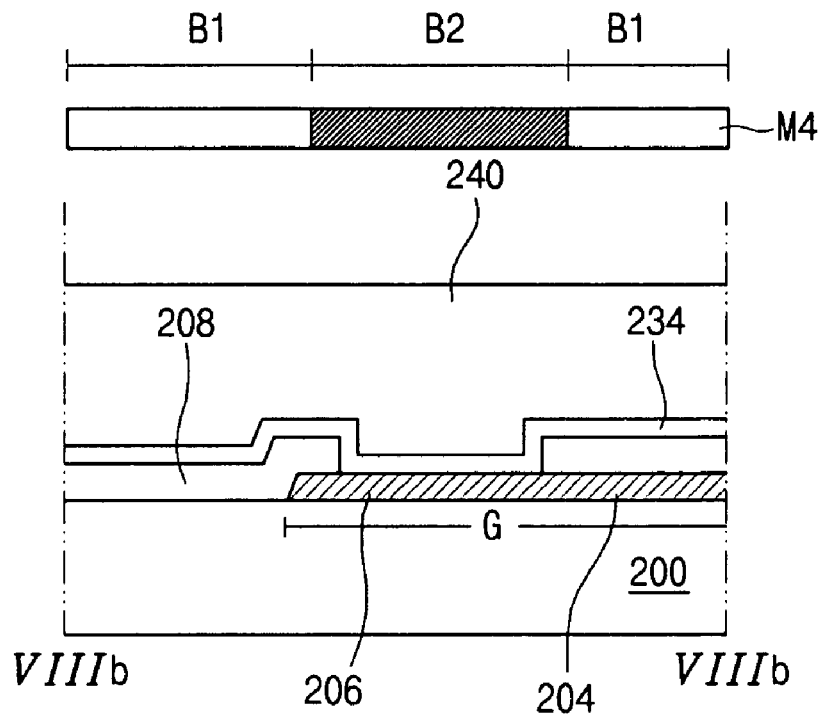
Figure 13J:
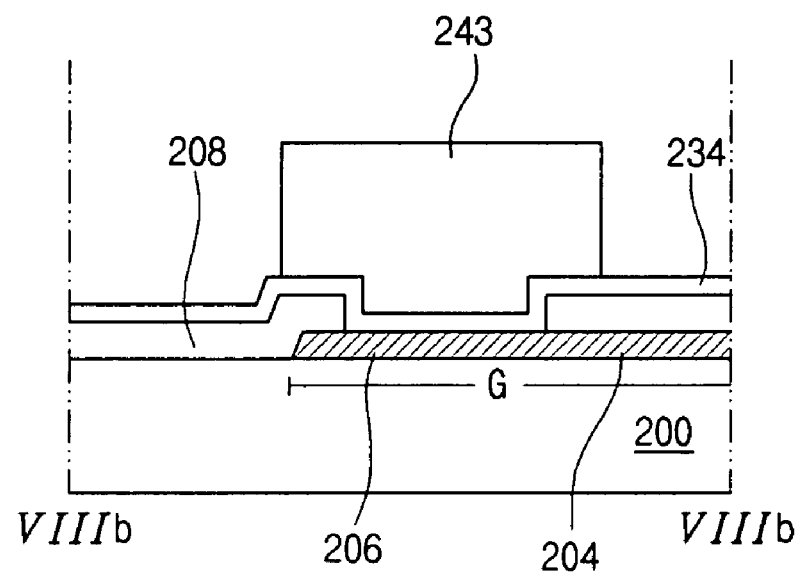
Figure 13K:
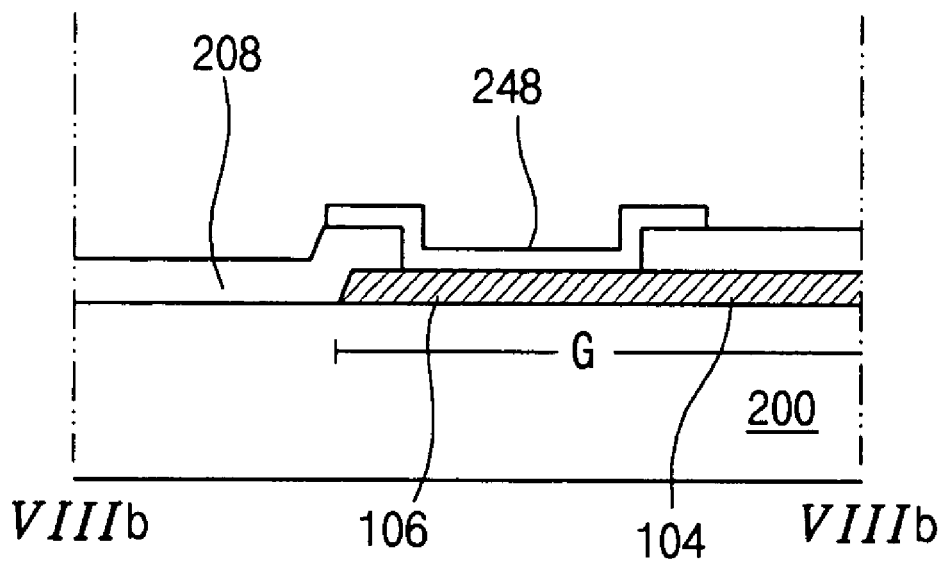
Figure 14I:
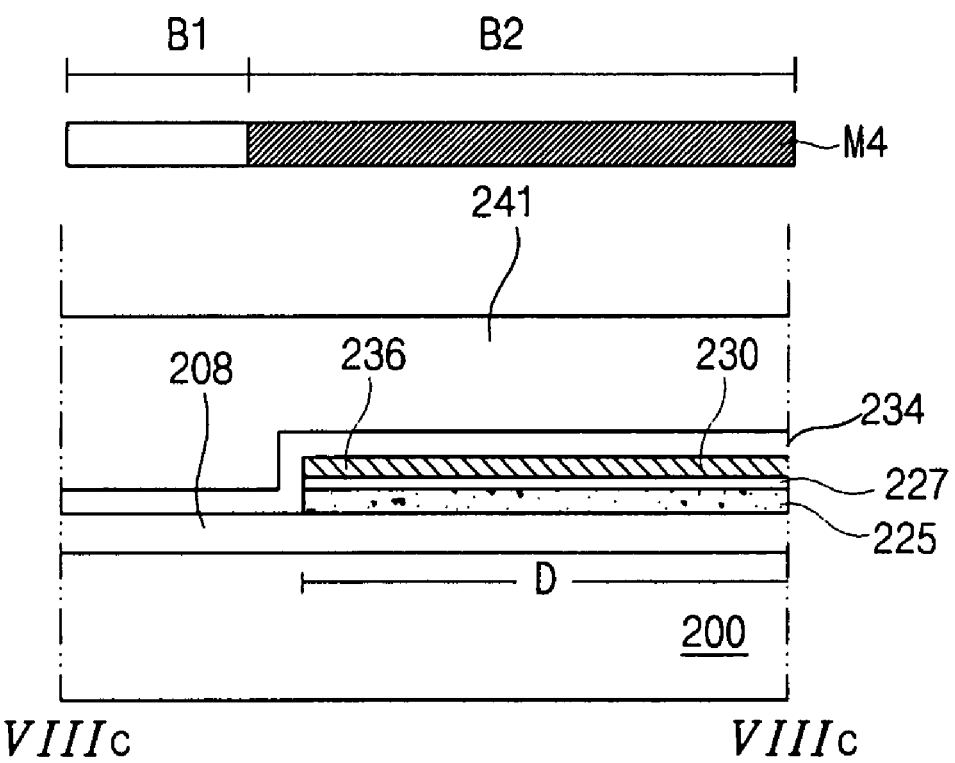

FIGS. 12I to 12K, 13I to 13K and 14I to 14K show a fourth mask process. As shown in FIGS. 12I, 13I and 14I, a transparent conductive material layer 234 and a third PR layer 241 are sequentially disposed on the buffer metal pattern 228a, the third data layer 230 and the data pad 232. The transparent conductive material layer 234 is formed of a respective material selected from a transparent conductive material group including indium-tin-oxide (ITO) and indium-zinc-oxide (IZO). A fourth mask M4 having a transmitting portion B1 and the blocking portion B2 is disposed over the third PR layer 241. The blocking portion B2 of the fourth mask M4 corresponds to the pixel region P, the data region D and the gate pad 206. The transmitting portion B1 of the fourth mask M4 corresponds to other portions. Particularly, the transmitting portion B1 of the fourth mask M4 corresponding to a center portion of the switching region S having a width less than the buffer metal pattern 228a. In addition, the transmitting portion B1 corresponds to a portion of the storage region C. The blocking portion B2 of the fourth mask M4 partially overlaps another portion of the storage region C. The third PR layer 241 is exposed to light through the fourth mask M4.

Figure 14J:
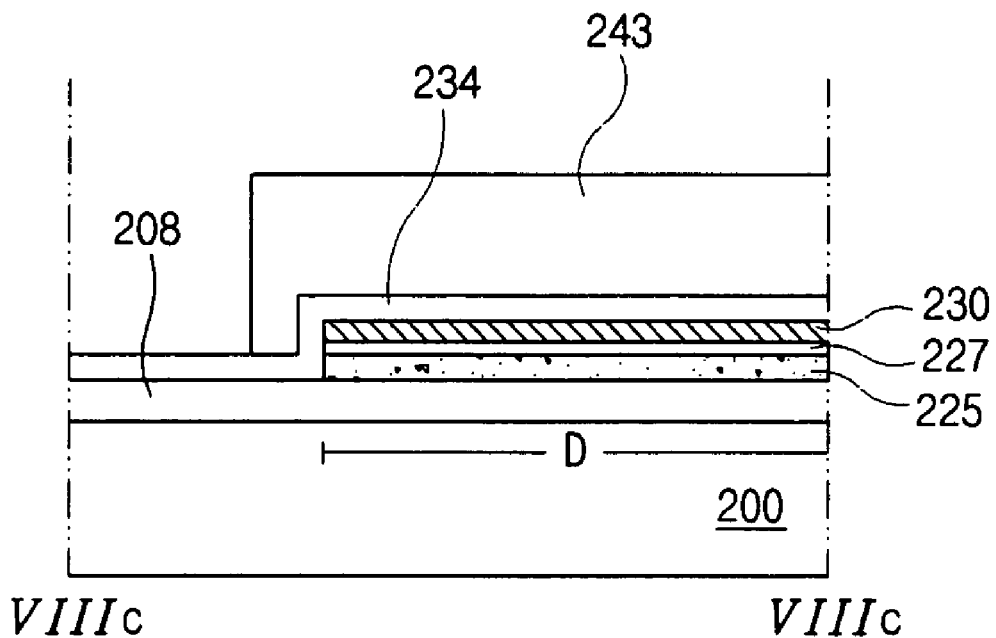

As shown in FIGS. 12J, 13J and 14J, the third PR layer 241 is exposed to form a fifth PR pattern 243. The fifth PR pattern 243 corresponds to the transmitting portion B1 of the fourth mask M4. Namely, the fifth PR pattern 243 corresponds to the pixel region P, the data region D and the gate pad 206. The transparent conductive material layer 234 corresponding to the transmitting portion B1 of the fourth mask M4 is exposed.

Figure 14K:
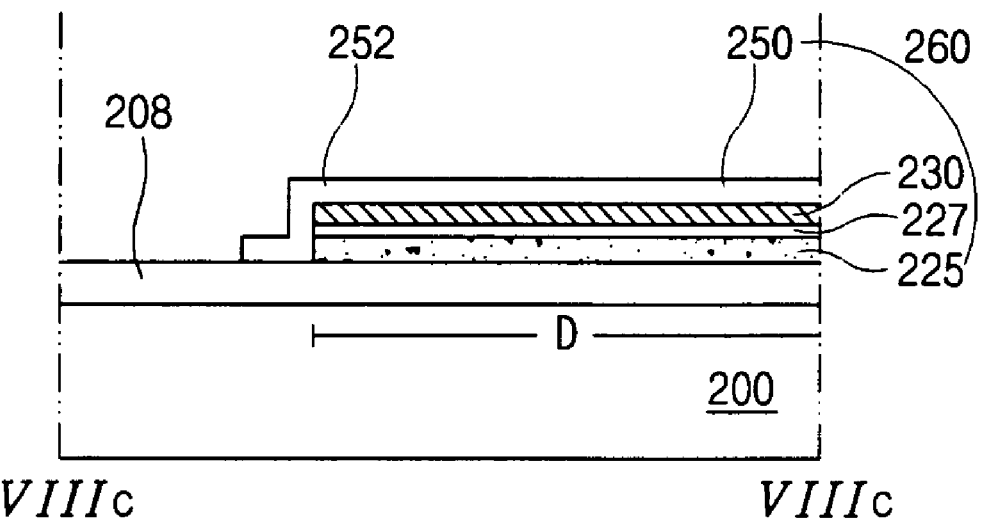

Next, as shown in FIGS. 12K, 13K and 14K, an exposed portion of the transparent conductive material layer 234 is etched using the fifth PR pattern 243 as an etching mask to form a pixel electrode 210, a source electrode 240, a drain electrode 242, a fourth data layer 250, a data pad terminal 252 and a gate pad terminal 248. The pixel electrode 246 is formed in the pixel region P. The pixel electrode 246 overlaps the gate line 204 in the storage region C to form a storage capacitor Cst. A portion of the gate line 204 overlapping the pixel electrode 246 functions as a first storage electrode, a portion of the pixel electrode 246 overlapping the gate line 204 functions as a second storage electrode, and the first insulating layer 208 between the first and second storage electrodes functions as a dielectric material layer. The overlapped portion of the gate line 204, the overlapped portion of the pixel electrode 246 and the first insulating layer 208 form the storage capacitor Cst.

The source and drain electrodes 240 and 242 are formed in the switching region S and spaced apart from each other to expose the buffer metal pattern 228a. The drain electrode 242 extends from the pixel electrode 246. The fourth data layer 250 extends from the source electrode 240. The fourth data layer 250 covers both an upper surface of the third data layer 230 and side surfaces of the first to third data layers 225, 227 and 230. The first to fourth data layers 225, 227, 230 and 250 form the data line 260. The data line 260 intersects the gate line 204 to define the pixel region P. The data pad terminal 252 extends from the fourth data layer 250 to contact the data pad 232. The data pad terminal 252 covers an upper surface of the data pad 232 and side surfaces of the data pad 232. The gate pad terminal 248 is formed on the gate pad 206 and contacts the gate pad 206 within the gate pad contact hole CH (of FIG. 13H). The gate pad 206 and gate pad terminal 248 are disposed at one end of the gate line 204. All of the source electrode 240, the drain electrode 242, the pixel electrode 246, the gate pad terminal 248, the fourth data layer 250 and the data pad terminal 252 are formed of a transparent conductive material. Then, the fifth PR pattern 243 is removed.

As shown in FIGS. 12J, the buffer metal pattern 228a exposed between the source and drain electrodes 240 and 242 and the ohmic contact pattern 226a under the buffer metal pattern 228a are etched using the source and drain electrodes 240 and 242 as an etching mask to form a buffer metal layer 228 and a ohmic contact layer 226. However, the active layer 224 is not exposed due to a presence of the etch stopper 214 on the active layer 124. When a dry etching method is available, the buffer metal pattern 228a (of FIG. 12J) and the ohmic contact pattern 226a (of FIG. 12J) are etched simultaneously. The buffer metal pattern 228a may include molybdenum (Mo). However, when a dry etching method is not available, the ohmic contact pattern 226a (of FIG. 12J) is dry-etched after the buffer metal pattern 228a (of FIG. 12J) is wet-etched. Since the active layer 224 is not exposed, there is no damage to the active layer 224 while forming the ohmic contact layer 226.

Through the above second exemplary four mask process, the exemplary array substrate according to the second exemplary embodiment is fabricated. In summary, the first mask process includes a step of forming the gate electrode, the gate line and the gate pad, the second mask process includes a step of forming the etch stopper and exposing the gate pad, the third mask process includes a step of forming the active layer, the first to third data layer, the data pad, and the fourth mask process includes a step of forming the data line, the source and drain electrodes, the buffer metal layer, the ohmic contact layer, the pixel electrode, the gate pad terminal and the data pad terminal.

In the exemplary array substrate for LCD device according to the exemplary embodiments of the present invention, since the active layer formed of the intrinsic amorphous silicon is perfectly shielded by the gate electrode, formation of wavy noise is prevented and aperture ratio is improved. In addition, the intrinsic amorphous silicon layer does not protrude beyond the data line, thereby generation of the light leakage current is prevented and properties of thin film transistor are improved. In addition, since a data line includes the opaque metal layer and the transparent conductive material layer, the data line is not disconnected even when the opaque metal layer is broken during fabricating process. Furthermore, since the source and drain electrode are formed of a transparent conductive material, light generated from the backlight unit under an array substrate is not reflected on the source and drain electrodes, thus no wavy noise is generated. Moreover, the active layer can be formed in a relatively thinner because of a presence of the etch stopper.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is

1. An array substrate for a liquid crystal display device, comprising:
   a gate line and a data line on a substrate intersecting each other, the data line includes a first layer formed of a transparent conductive material and a second layer under the first layer;
   a thin film transistor including a gate electrode connected to the gate line formed at respective intersection of the gate and data lines, an insulating layer on the gate electrode, an active layer on the insulating layer and disposed within a width of the gate electrode, an etch stopper on the active layer, an ohmic contact layer on the etch stopper, a source electrode on the ohmic contact layer and connected to the first layer, a drain electrode spaced apart from the source electrode;
   a pixel electrode connected to the drain electrode, wherein the source electrode, the drain electrode and the pixel electrode are formed of the same layer and the same material as the first layer; and
   a buffer metal layer between the ohmic contact layer and the source electrode and between the ohmic contact layer and the drain electrode,
   wherein the buffer metal layer is disposed within a width of the active layer.

2. The array substrate according to claim 1, wherein the buffer metal layer includes molybdenum.

3. The array substrate according to claim 1, wherein the second layer is formed of the same layer and the same material as the buffer metal layer.

4. The array substrate according to claim 1, wherein the etch stopper is disposed within a width of the active layer, and the ohmic contact layer contacts the active layer.

5. The array substrate according to claim 1, wherein the data line further includes third and fourth layers formed of the same layer and the same material as the ohmic contact layer and the active layer, respectively.

6. The array substrate according to claim 5, wherein side surfaces of the second, third and fourth layers are covered with the first layer.

7. The array substrate according to claim 1, further comprising a gate pad at one end of the gate line, a gate pad terminal contacting the gate pad and including the transparent conductive material, a data pad at one end of the data line, and a data pad terminal contacting the data pad and including the transparent conductive material.

8. The array substrate according to claim 1, wherein the pixel electrode extends and overlaps the gate line to form a storage capacitor, wherein a portion of the gate line overlapping the pixel electrode is a first storage electrode, a portion of the pixel electrode overlapping the gate line is a second storage electrode and the insulating layer between the overlapping portion of the gate line and the pixel electrode is a dielectric material.

* * * * *